(12) United States Patent  
Lee et al.

(10) Patent No.: US 8,836,064 B2
(45) Date of Patent: Sep. 16, 2014

(54) ENHANCED LIFT-OFF TECHNIQUES FOR USE WITH DIELECTRIC OPTICAL COATINGS AND LIGHT SENSORS PRODUCED THEREFROM

(75) Inventors: Eric S. Lee, San Francisco, CA (US); Michael I-Shan Sun, San Jose, CA (US); Francois Hebert, San Mateo, CA (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 13/530,809

(22) Filed: Jun. 22, 2012

(65) Prior Publication Data

US 2013/0249032 A1 Sep. 26, 2013

Related U.S. Application Data

(60) Provisional application No. 61/613,283, filed on Mar. 20, 2012.

(51) Int. Cl.
*H01L 31/0232* (2014.01)

(52) U.S. Cl.
USPC .......................................................... 257/432

(58) Field of Classification Search
USPC .......................................................... 257/432
See application file for complete search history.

(56) References Cited

U.S. PATENT DOCUMENTS

| | | | |
|---|---|---|---|
| 4,238,559 A * | 12/1980 | Feng et al. | 430/156 |
| 5,753,375 A | 5/1998 | Ray | |
| 5,763,143 A * | 6/1998 | Sakura | 430/330 |
| 5,801,373 A | 9/1998 | Oozu et al. | |
| 6,218,719 B1 | 4/2001 | Tsang | |
| 6,596,981 B1 | 7/2003 | Aswell et al. | |
| 6,743,652 B2 | 6/2004 | Thomas et al. | |
| 7,163,832 B2 | 1/2007 | Kim | |
| 7,394,059 B2 | 7/2008 | Fukuyoshi et al. | |
| 7,485,486 B2 | 2/2009 | Zheng et al. | |
| 2004/0102034 A1 * | 5/2004 | Ito et al. | 438/637 |
| 2004/0104387 A1 * | 6/2004 | Mogamiya et al. | 257/40 |
| 2005/0186754 A1 | 8/2005 | Kim | |
| 2005/0287479 A1 | 12/2005 | Moon | |
| 2008/0067330 A1 * | 3/2008 | Yamamoto | 250/226 |
| 2008/0191298 A1 | 8/2008 | Lin et al. | |
| 2011/0132443 A1 * | 6/2011 | Schultz-Wittman et al. | 136/252 |

OTHER PUBLICATIONS

Stanley Wolf et al., "Silicon Processing for the VLSI Era", Lattice Press, 1986, ISBN 0-961672-3-7.*

* cited by examiner

*Primary Examiner* — Andy Huynh
*Assistant Examiner* — Sitaramarao S Yechuri
(74) *Attorney, Agent, or Firm* — Vierra Magen Marcus LLP

(57) ABSTRACT

Light sensors including dielectric optical coatings to shape their spectral responses, and methods for fabricating such light sensors in a manner that accelerates lift-off processes and increases process margins, are described herein. In certain embodiments, a short duration soft bake is performed. Alternatively, or additionally, temperature cycling is performed. Alternatively, or additionally, photolithography is performed using a photomask that includes one or more dummy corners, dummy islands and/or dummy rings. Each of the aforementioned embodiments form and/or increase a number of micro-cracks in the dielectric optical coating not covering the photodetector sensor region, thereby enabling an accelerated lift-off process and an increased process margin. Alternatively, or additionally, a portion of the photomask can include chamfered corners so that the dielectric optical coating includes chamfered corners, which improves the thermal reliability of the dielectric optical coating.

16 Claims, 22 Drawing Sheets

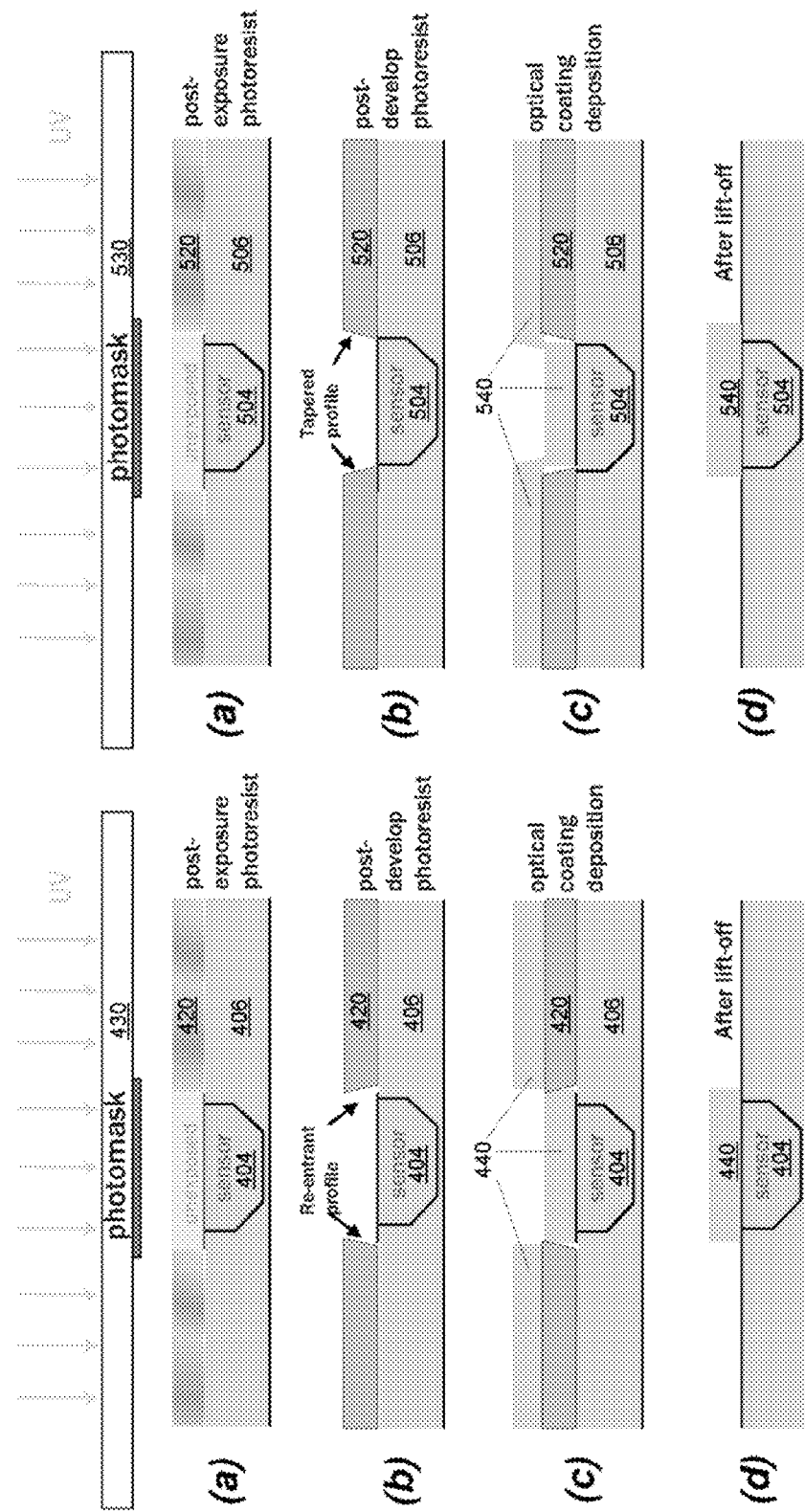

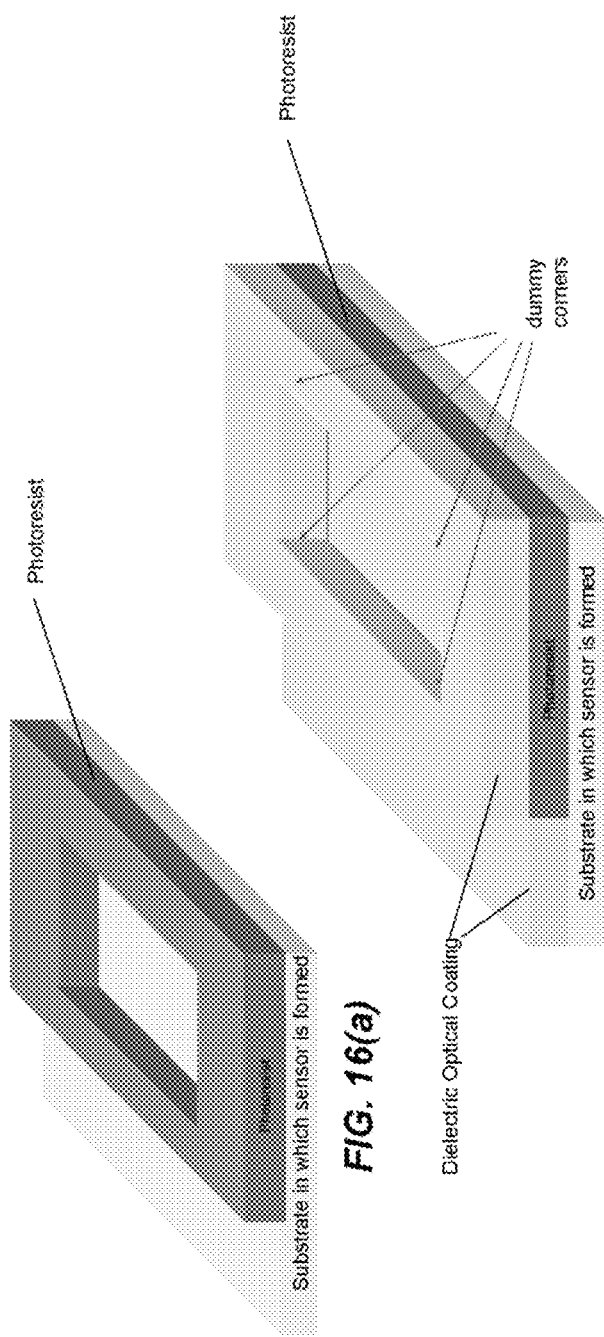
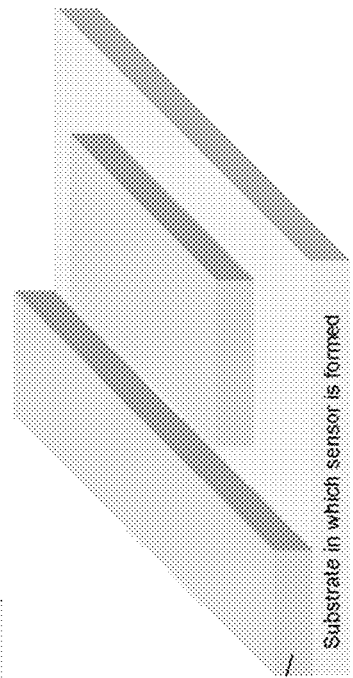
FIG. 16(a)
FIG. 16(b)
FIG. 16(c)

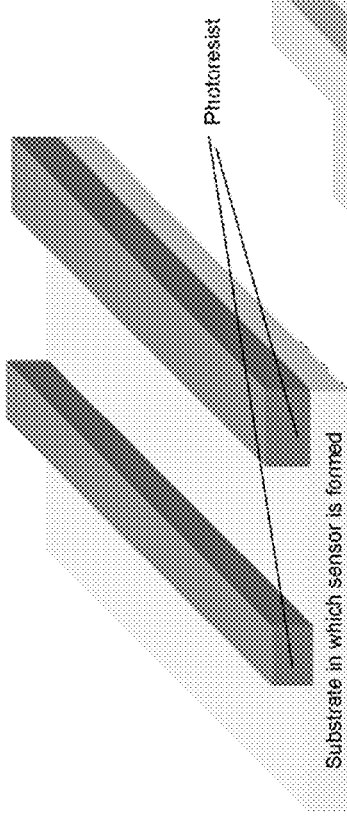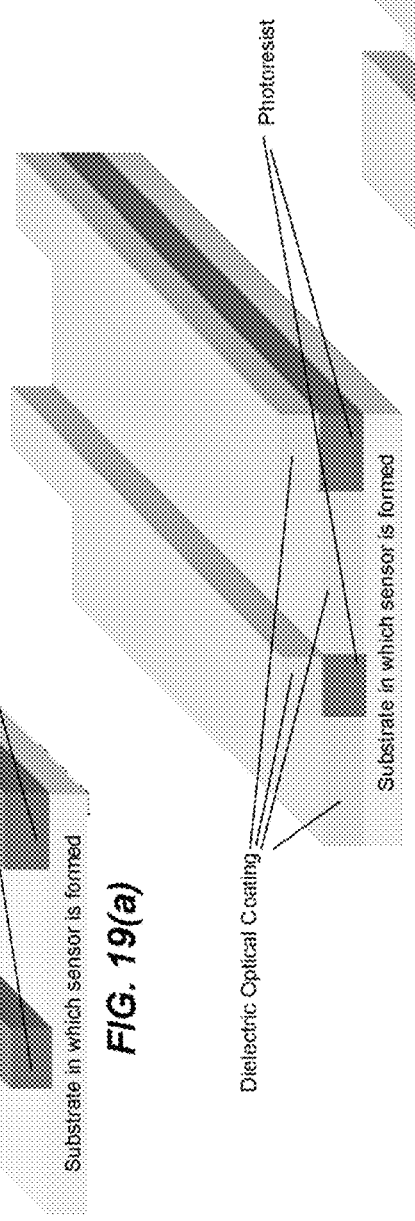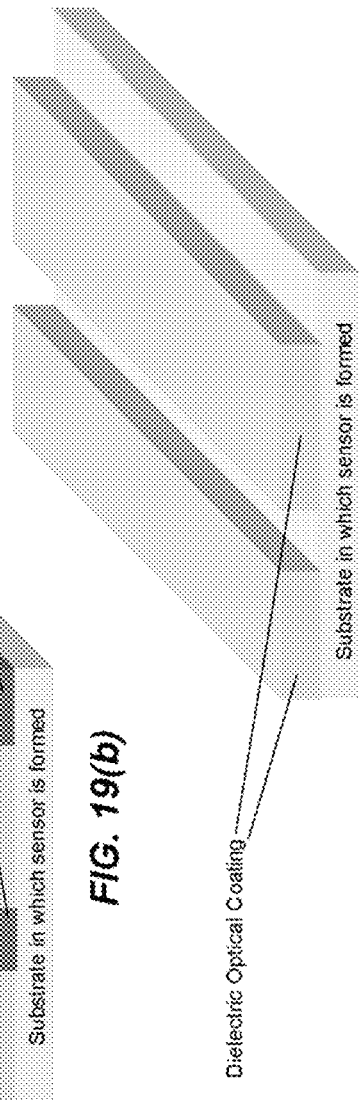

ENHANCED LIFT-OFF TECHNIQUES FOR USE WITH DIELECTRIC OPTICAL COATINGS AND LIGHT SENSORS PRODUCED THEREFROM

PRIORITY CLAIMS

This application claims priority under 35 U.S.C. 119(e) to U.S. Provisional Patent Application No. 61/613,283, filed Mar. 20, 2012, which is incorporated herein by reference.

RELATED APPLICATION

This application is related to commonly assigned and commonly invented U.S. patent application Ser. No. 13/530,675, filed the same day as the present application, which is entitled ENHANCED LIFT-OFF TECHNIQUES FOR USE WHEN FABRICATING LIGHT SENSORS INCLUDING DIELECTRIC OPTICAL COATING FILTERS, which is incorporated herein by reference.

BACKGROUND

FIG. 1 shows a cross section of an exemplary conventional light sensor 102, which is essentially a single photodiode, also referred to as a photodetector. The photodetector 102 includes an $N^+$ region 104, which is heavily doped, and a $P^-$ region 106 (which can be a $P^-$ epitaxial region), which is lightly doped. All of the above is likely formed on a $P^+$ or $P^{++}$ substrate 108, which is heavily doped. It is noted that FIG. 1 and the remaining FIGS. are not drawn to scale.

Still referring to FIG. 1, the $N^+$ region 104 and $P^-$ region 106 form a PN junction, and more specifically, a $N^+/P^-$ junction. This PN junction is reversed biased, e.g., using a voltage source (not shown), which causes a depletion region 110 around the PN junction. When light 112 is incident on the photodetector 102 (and more specifically on the $N^+$ region 104), electron-hole pairs are produced in and near the diode depletion region 110. Electrons are immediately pulled toward $N^+$ region 104, while holes get pushed down toward $P^-$ region 106. These electrons (also referred to as carriers) are captured in $N^+$ region 104 and produce a measurable photocurrent, which can be detected, e.g., using a current detector (not shown). This photocurrent is indicative of the intensity of the light 112, thereby enabling the photodetector to be used as a light sensor. The portion of the photodetector 102 that produces a photocurrent in response to light incident on the photodetector can be referred to as the photodetector sensor region, or simply as the sensor region.

Photodetectors, such as but not limited to the exemplary photodetector 102, can be used as ambient light sensors (ALSs), e.g., for use as energy saving light sensors for displays, for controlling backlighting in portable devices such as mobile phones and laptop computers, and for various other types of light level measurement and management. For more specific examples, ambient light sensors can be used to reduce overall display-system power consumption and to increase Liquid Crystal Display (LCD) lifespan by detecting bright and dim ambient light conditions as a means of controlling display and/or keypad backlighting. Without ambient light sensors, LCD display backlighting control is typically done manually whereby users will increase the intensity of the LCD as the ambient environment becomes brighter. With the use of ambient light sensors, users can adjust the LCD brightness to their preference, and as the ambient environment changes, the display brightness adjusts to make the display appear uniform at the same perceived level; this results in battery life being extended, user eye strain being reduced, and LCD lifespan being extended. Similarly, without ambient light sensors, control of the keypad backlight is very much dependent on the user and software. For example, keypad backlight can be turned on for 10 seconds by a trigger which can be triggered by pressing the keypad, or a timer. With the use of ambient light sensors, keypad backlighting can be turned on only when the ambient environment is dim, which will result in longer battery life. In order to achieve better ambient light sensing, ambient light sensors preferably have a spectral response close to the human eye response and have excellent infrared (IR) noise suppression. Such a spectral response is often referred to as a "true human eye response" or a "photopic response".

FIG. 2 shows an exemplary spectral response of a photodetector (e.g., the photodetector 102) without any spectral response shaping, e.g., using a filter covering the detector. FIG. 3 illustrates the spectral response of a typical human eye (also known as the "true human eye response" or the "photopic response", as mentioned above). As can be appreciated from FIGS. 2 and 3, a potential problem with using a photodetector as an ambient light sensor is that it detects both visible light and non-visible light, such as infrared (IR) light, which starts at about 700 nm. By contrast, notice from FIG. 3 that the human eye does not detect IR light. Thus, the response of a photodetector can significantly differ from the response of a human eye, especially when the light is produced by an incandescent light, which produces large amounts of IR light. This would provide for significantly less than optimal adjustments if the photodetector were used as an ambient light sensor, e.g., for adjusting backlighting, or the like. Accordingly, various techniques have been attempted to provide light sensors that have a spectral response closer to that of a human eye, so that such light sensors can be used, e.g., for appropriately adjusting the backlighting of displays, or the like. Some of these techniques involve covering such light sensor with optical filters.

Typically, organic based optical filters cannot be used to provide a true human eye response, because organic based optical filters do not sufficiently absorb and/or reflect infrared light. Rather, non-organic filters, such as filters made of dielectric optical coatings, are generally preferred because they provide better performance. Such dielectric optical coatings, which are made from stacks of various dielectric films, are conventionally expensive to implement. This is in part because they are typically patterned using a photoresist lift-off in a chemical solvent bath, which is typically costly due to the relatively long residence time (i.e., soak duration) in the photoresist solvent bath, and due to the relatively narrow process margin. Alternatively, acoustic cleaning can be used, which is also typically costly.

BRIEF DESCRIPTION OF THE DRAWINGS

FIG. 4 illustrates a conventional lift-off process with a negative profile photoresist.

FIG. 5 illustrates a conventional lift-off process with a positive profile photoresist.

FIG. 16 includes perspective cross-sectional views that correspond to a portion of the light sensor shown in FIG. 15 during different steps of a fabrication process.

FIG. 19 includes perspective cross-sectional views that correspond to a portion of the light sensor shown in FIG. 18 during different steps of a fabrication process of an embodiment of the present invention.

DETAILED DESCRIPTION

Figure 1:
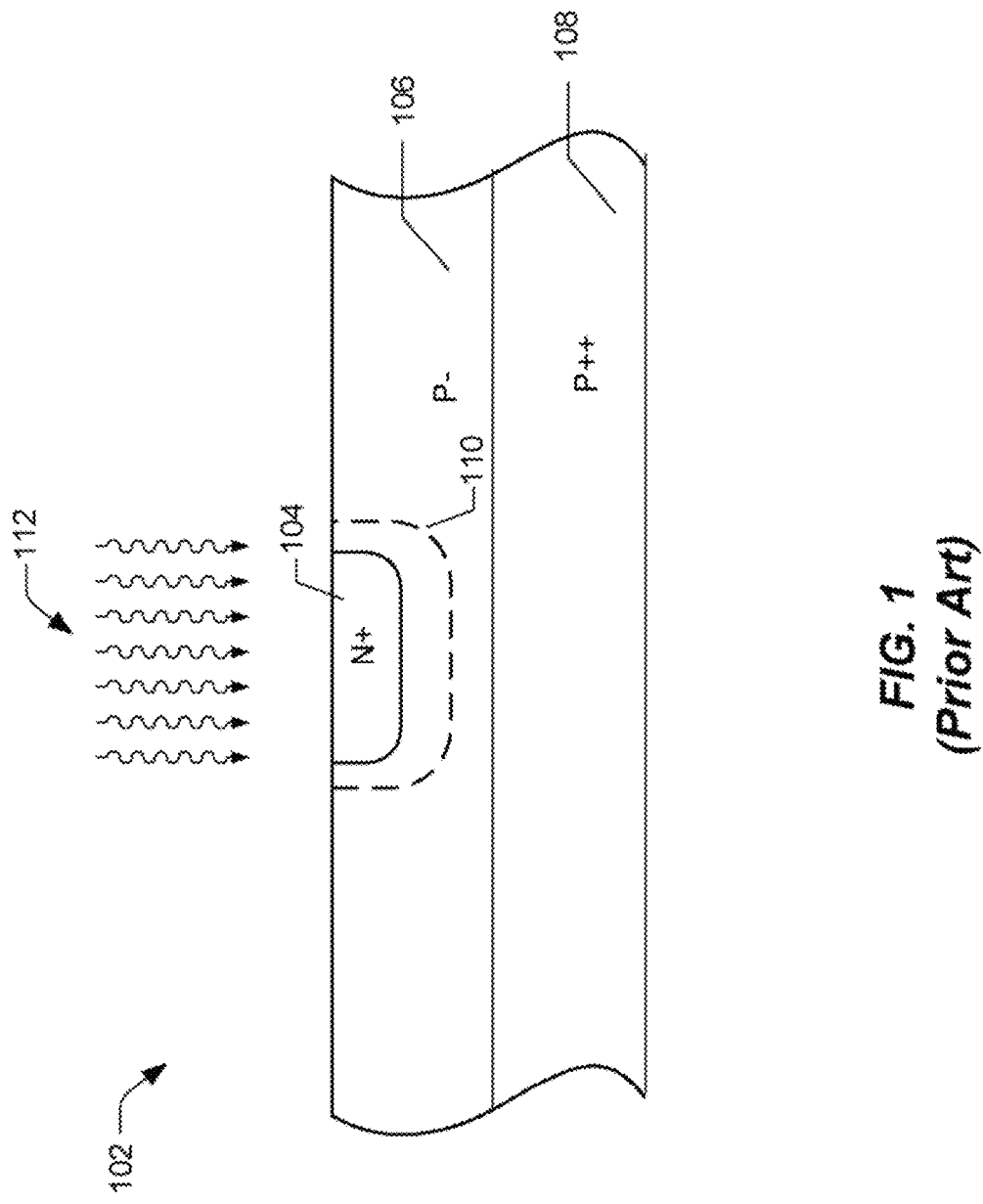
FIG. 1 shows a cross section of an exemplary conventional photodetector.
Figure 2:
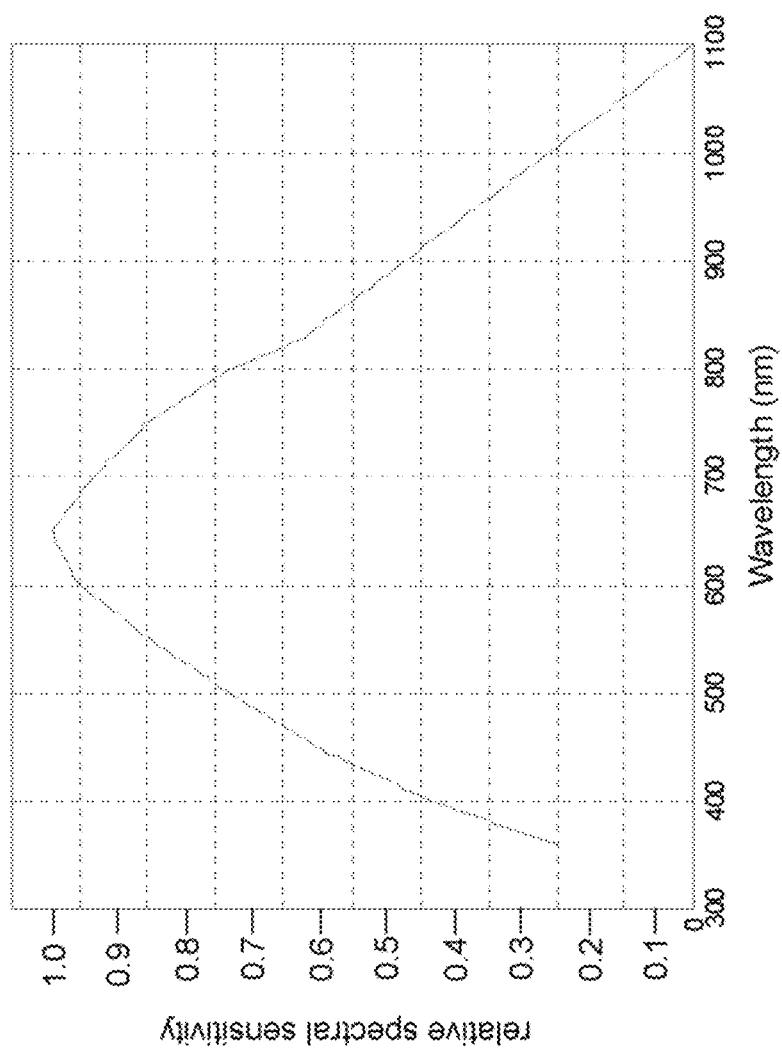
FIG. 2 shows an exemplary spectral response of a photodetector, such as the photodetector of FIG. 1, without any spectral response shaping.
Figure 3:
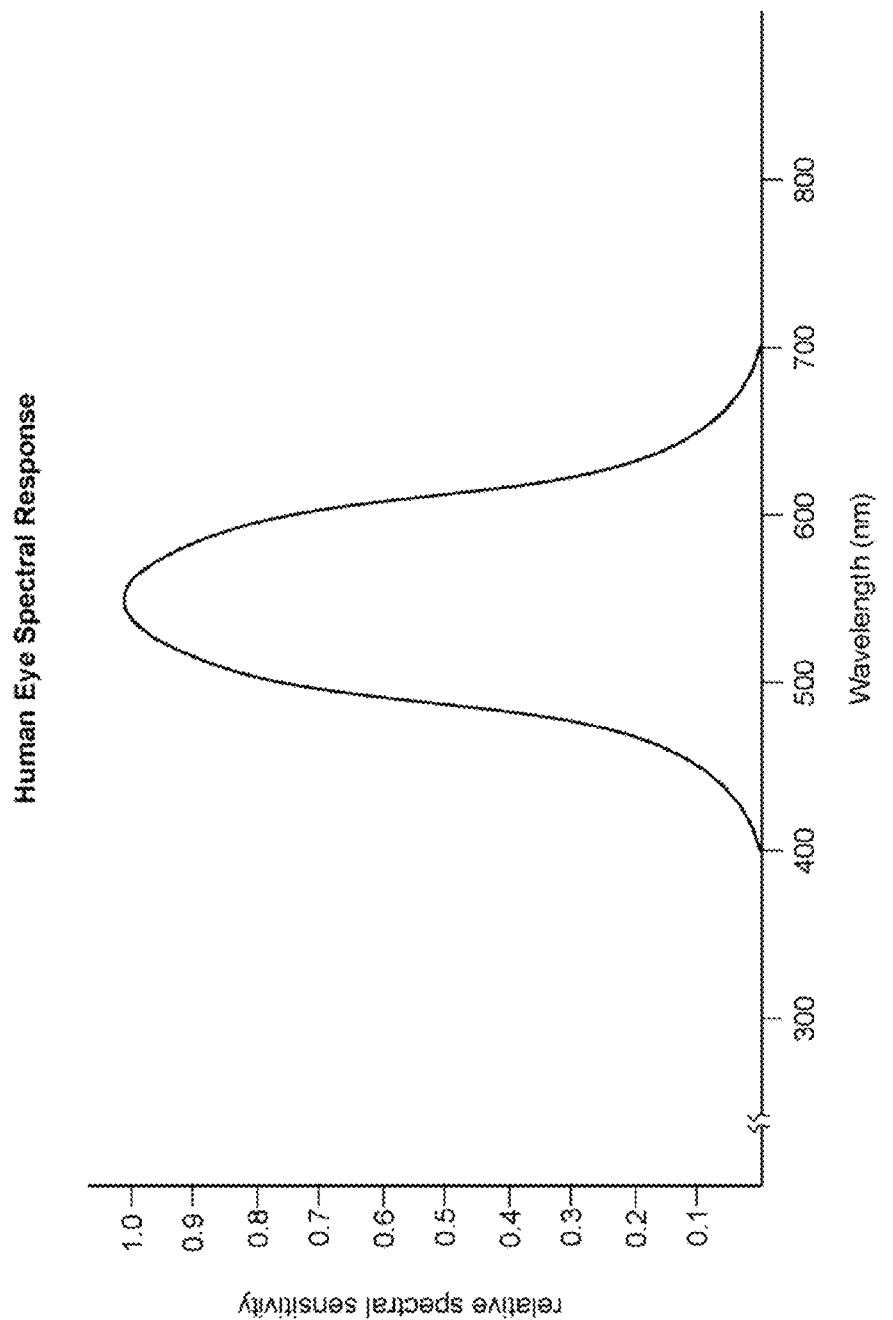
FIG. 3 illustrates the spectral response of a typical human eye.

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to like parts or elements throughout. In addition, the first digit of a reference number identifies the drawing in which the reference number first appears.

Certain embodiments of the present invention relate to improving lift-off processes used to produce light sensors (e.g., ambient light sensors) with increased process margins. Accordingly, before describing such embodiments of the present invention, it is first useful to describe conventional lift-off processes, so that the deficiencies being overcome by embodiments of the present invention can be better understood. Accordingly, conventional lift-off processes will first be described with reference to FIGS. 4 and 5. More specifically, FIG. 4, which includes FIGS. 4(a), (b), (c) and (d), illustrates a conventional lift-off process that utilizes a photoresist having a negative profile (which is also known as a re-entrant profile). FIG. 5, which includes FIGS. 5(a), (b), (c) and (d), illustrates a conventional lift-off process that utilizes a photoresist having a positive profile (which is also known as a tapered profile). The light sensors generally shown in FIGS. 4 and 5, and other FIGS., can have a structure similar to the photodetector 102 described with reference to FIG. 1, but are not limited thereto, as would be clear to one of ordinary skill in the art. For example, the light sensors can include $P^+/N^-$ junctions, or $N^+/P^-$ junctions, or PIN, NPN, PNP or NIP junctions, but are not limited thereto. Regardless of the exact structure of the light sensor, the light sensor will includes a photodetector sensor region that produces a photocurrent in response to light incident on the light sensor.

Referring to FIGS. 4(a) and 5(a), a photodetector sensor region 404, 504 formed in a semiconductor substrate 406, 506 is covered with a photoresist layer 420, 520 (also simply referred to as a photoresist). The photoresist 420, 520 is covered with a photomask 430, 530 and is exposed to ultraviolet (UV) light. As the term is used herein, UV light is also meant to also include deep ultraviolet light (DUV). This causes exposure of a portion of the photoresist to the UV light, while another portion of the photoresist is unexposed to the UV light. Thereafter, a developer is used to remove the photoresist that was unexposed to UV light, without removing the photoresist that was exposed to UV light, as shown in FIGS. 4(b) and 5(b). Depending upon the type of photoresist used, the post-develop photoresist can have a negative profile (also known as a re-entrant profile), as shown in FIG. 4(b), or a positive profile (also known as a tapered profile), as shown in FIG. 5(b). Thereafter, a dielectric optical coating 440, 540 is deposited, to thereby form a dielectric optical filter over the light sensor, as shown in FIGS. 4(c) and 5(c). The dielectric optical coating, which can also be referred to as a dielectric optical filter, is made from a stack of dielectric films. A lift-off process using a chemical solvent is thereafter used to remove the remaining photoresist 420, 520 and the dielectric optical coating 440, 540 covering the photoresist, resulting in the structures shown in FIGS. 4(*d*) and 5(*d*).

A problem with conventional lift-off techniques is that following the dielectric optical coating deposition (illustrated in FIGS. 4(*c*) and 5(*c*)), the lift-off process requires a very long soak duration (on the order of multiple hours) due to the photoresist not being fully exposed to the solvent. While the exact soak duration (also know as lift-off duration) depends on the thickness of the dielectric optical coating, the thickness of the photoresist, the chemical solvent, and the type of lift-off equipment used, tests have shown that soak durations of up to nine hours may be necessary to perform the lift-off process. Such high soak durations are necessary, at least in part due to the dielectric optical coating being highly conformal, even where the photoresist utilized has a negative profile. Various embodiments of the present invention, which are described below, are used to accelerate the lift-off process and increase the process margin for photoresist removal following deposition of the dielectric optical coating. By accelerating the lift-off process and increasing the process margin, embodiments of the present invention provide for more inexpensive light sensors that include dielectric optical coatings to shape their spectral response.

Certain embodiments of the present invention described with reference to FIG. 6, which includes FIGS. 6(*a*), (*b*), (*c*), (*d*), and (*e*), involve the use of a short duration soft baking step (also referred to as a soft bake process) that occurs after the deposition of the dielectric optical coating, but before performance of the lift-off step using a solvent.

Figure 6:
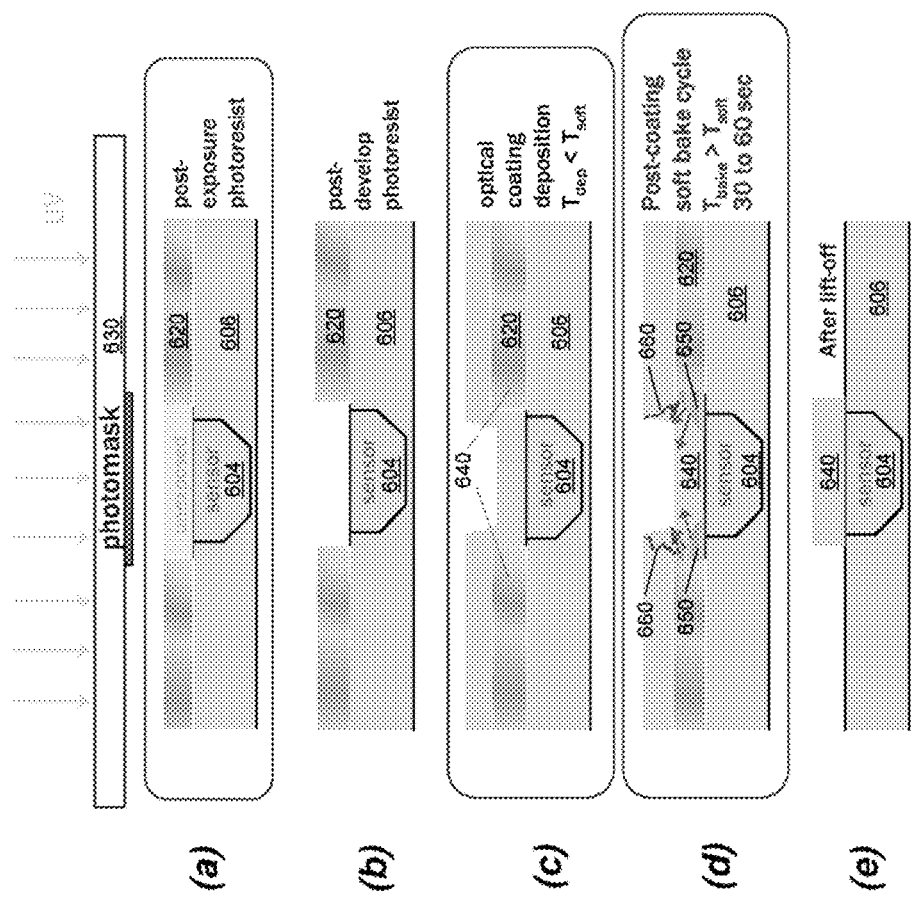
FIG. 6 illustrates a soft bake process, according to an embodiment of the present invention, which provides for a more rapid lift-off process and an increased process margin.

Referring to FIG. 6(*a*), a photoresist 620 is deposited on a photodetector sensor region 604 formed in a semiconductor substrate 606. Still referring to FIG. 6(*a*), a photomask 630 is used to selectively expose a portion of the underlying structure to UV light, causing exposure of a portion of the photoresist to the UV light, while another portion of the photoresist is unexposed to the UV light. As shown in FIG. 6(*b*), a developer is then used to remove the photoresist 620 that was unexposed to UV light, without removing the photoresist that was exposed to UV light. While the profile of the remaining photoresist shown in FIG. 6(*b*) is a vertical profile (which is also known as a neutral profile), the photoresist profile can alternatively be negative or positive (as shown in FIGS. 4(*b*) and 5(*b*), respectively).

Thereafter, the dielectric optical coating 640 is deposited, to thereby form a dielectric optical filter over the light sensor, as shown in FIG. 6(*c*). In accordance with an embodiment, the photoresist has a softening temperature ($T_{soft}$, which is also known as the softening point) that is higher than the temperature ($T_{dep}$) at which the deposition of the dielectric optical coating is performed. Stated another way, in accordance with an embodiment, the optical coating deposition is performed at a temperature ($T_{dep}$) below the softening point ($T_{soft}$) of the photoresist, i.e., $T_{dep} < T_{soft}$. Most photoresists have a softening point ($T_{soft}$) in the range of 100-130 degrees Celsius. At this point, the dielectric optical coating 640 covers the photodetector sensor region 604, a circumferential area surrounding the sensor region 604, and the portion of the photoresist 620 that remained after the developer was used to remove the photoresist that was unexposed to UV light.

In accordance with an embodiment, following the deposition of the dielectric optical coating 640, a short duration soft bake is performed at a temperature ($T_{soft\_bake}$) above the softening point ($T_{soft}$) of the photoresist, i.e., $T_{soft\_bake} > T_{soft}$. While the duration of the soft bake is dependent on the thickness and type of the photoresist, it is estimated that the soft bake duration should be about 0.5 to 1 minute per micron (μm) thickness of the photoresist. Since the typical photoresist thickness ranges from about 3 to 6 μm, the soft bake process would likely take about 1.5 minutes to about 6 minutes, but may take less or more time. Preferably, the soft bake time does not exceed 15 minutes, and more preferably does not exceed 5 minutes. The soft bake causes thermal expansion of the dielectric optical coating and the photoresist, and also causes photoresist reflow, which individually and collectively cause tensile mechanical strain at the sidewall of the dielectric optical coating, which in-turn causes micro-cracks to form in the dielectric optical coating. The photoresist reflow is generally shown at 650 in FIG. 6(*d*). The micro-cracks are generally illustrated by the dashed crooked line 660 in FIG. 6(*d*). A lift-off process using a solvent is thereafter performed to remove the remaining photoresist and the dielectric optical coating covering the photoresist, which results in the structure shown in FIG. 6(*e*). The micro-cracks 660 provide additional avenues for the lift-off solvent to reach the photoresist during the lift-off process, thereby significantly reducing the soak duration required for lift-off.

The use of the soft bake step should reduce the soak duration (during the lift-off process) by at least a factor of two, and potentially by a factor of ten or more. For example, it is estimated that the lift-off process will take about 15 to 30 minutes following the soft bake step, which is significantly faster than the up to nine hours it might take if the soft bake step was not performed.

Figure 7:
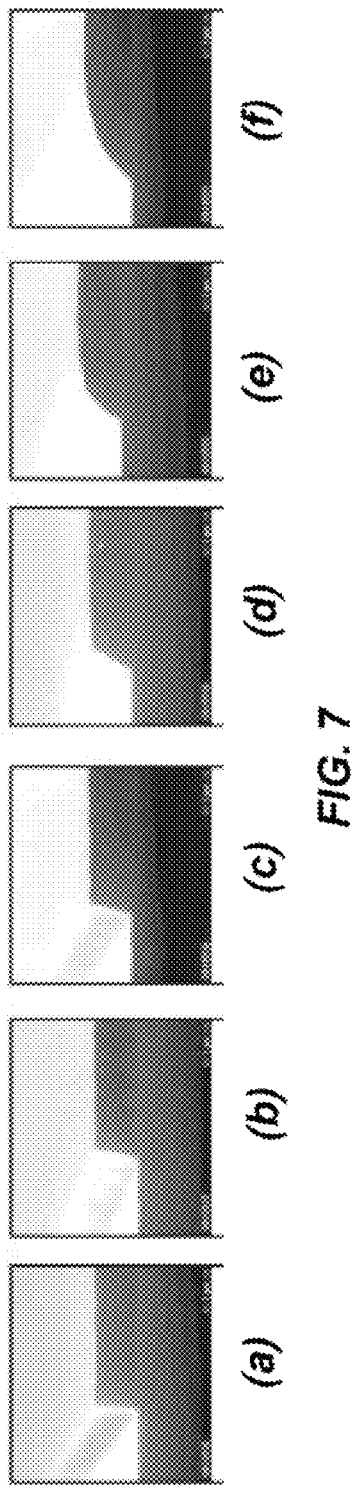
FIG. 7 provides illustrations of the photoresist reflow that occurs during the soft bake process.

FIG. 7, which includes FIGS. 7(*a*), (*b*), (*c*), (*d*), (*e*) and (*f*), illustrates in more detail how the photoresist reflow occurs during the a short duration soft bake process. More specifically, the photoresist in FIG. 7(*a*) is shown as having a vertical profile (also known as a neutral profile), similar to the photoresist profile shown in FIG. 6(*b*). As can be appreciated from FIGS. 7(*b*), (*c*), (*d*) and (*e*), the photoresist profile begins to become rounded due to reflow, resulting in the photoresist profile of FIG. 7(*f*) at the end of the short duration soft bake process. In accordance with specific embodiments, the short duration soft bake process occurs for about 15 minutes or less, and preferably for about 5 minutes or less, and even more preferably for about 2 minutes or less. In specific embodiments, the short duration soft bake process occurs for between about 30 and 60 seconds.

While it is preferred that the soft bake is performed at a temperature ($T_{soft\_bake}$) above the softening point temperature ($T_{soft}$) of the photoresist, i.e., $T_{soft\_bake} > T_{soft}$, micro-cracks would likely also occur at temperatures just below the softening point ($T_{soft}$), e.g., within 10 degrees Celsius of the softening point temperature. It is also noted that the soft bake process is preferably not performed at a temperature that is much greater than the softening point temperature ($T_{soft}$), so at to prevent the photoresist from liquefying.

While it is preferred that the soft bake is performed at a temperature ($T_{soft\_bake}$) above the softening point temperature ($T_{soft}$) of the photoresist, i.e., $T_{soft\_bake} > T_{soft}$, micro-cracks should also occur at temperatures just below the softening point temperature ($T_{soft}$), e.g., within 10 degrees Celsius of the softening point temperature. Accordingly, the short duration soft bake can be more generally be performed within a predetermined range of the softening point ($T_{soft}$) of the photoresist to thereby form and/or increase a number of micro-cracks in the dielectric optical coating that is not covering the photodetector sensor region. In accordance with an embodiment, the predetermined range of the softening point temperature ($T_{soft}$) of the photoresist is +/−10 degrees Celsius of the softening point temperature ($T_{soft}$).

Figure 8:
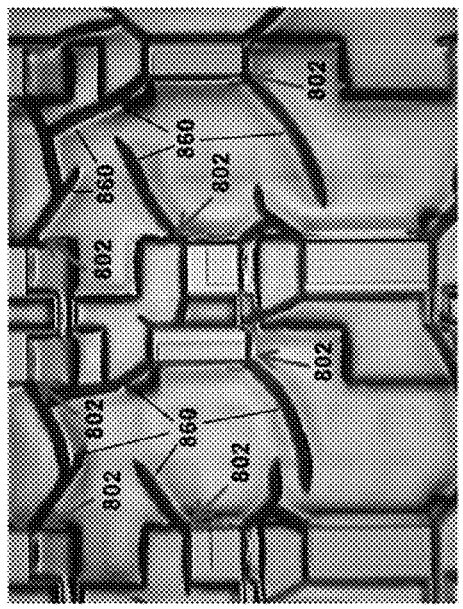
FIG. 8 provides illustrations of the micro-cracks that occur in the dielectric optical coating as a result of the soft bake process.

Referring now to FIG. 8, the arrows 802 shown therein point to corners of the photoresist where micro-cracks 860 in the dielectric optical coating originated due to the high mechanical stresses caused by the soft bake process. The micro-cracks 860 illustrate the same type of micro-cracks 660 discussed above with reference to FIG. 6.

Figure 10:
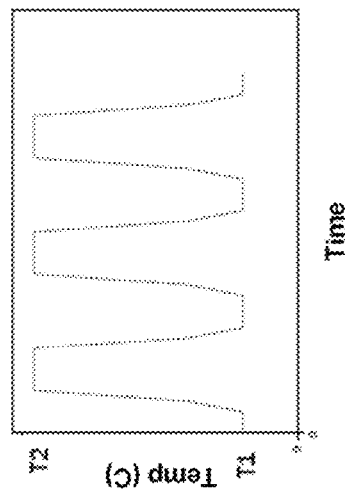
FIG. 10 illustrates an example of the temperature cycling involved in the thermal shock process.

Further embodiments of the present invention, which will be described with reference to FIGS. 9 and 10, involve the use of thermal shock (also referred to as temperature cycling) after the deposition of the dielectric optical coating, but before performance of the lift-off step using a solvent.

Figure 9:
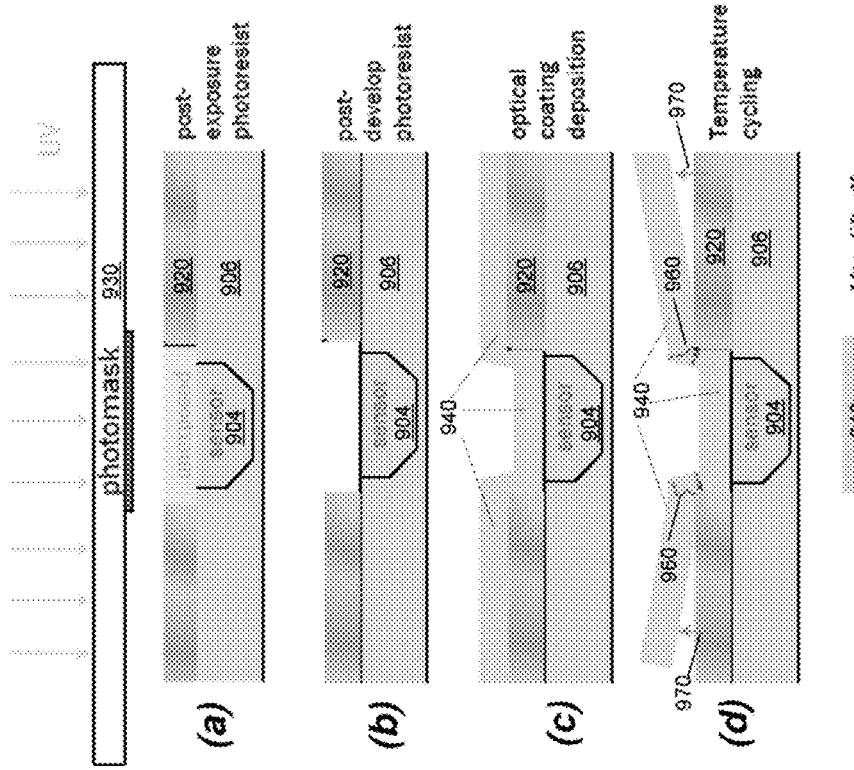
FIG. 9 illustrates a thermal shock process, according to an embodiment of the present invention, which provides for a more rapid lift-off process and an increased process margin.

FIGS. 9(*a*), (*b*) and (*c*) of FIG. 9 are similar to FIGS. 6(*a*), (*b*) and (*c*) of FIG. 6, and thus, need not be described again. More specifically, in FIG. 9, the reference numerals 904, 906, 920, 930 and 940 represent substantially the same elements as the reference numerals 604, 606, 620, 630 and 640 in FIG. 6, and thus these elements need not be described again. Referring to FIG. 9(*d*) and FIG. 10, after the deposition of the optical coating 940, thermo-mechanical stresses are introduced by cycling between two (or more) temperatures T1 and T2, where T1<<T2. In specific embodiments, the temperature T2 is between about 50 and 150 degrees Celsius greater than the temperature T1. More specifically, the temperature T1 is within the range of about 0 to 50 degrees Celsius, and the temperature T2 is within the range of about 100 to 150 degrees Celsius, in accordance with an embodiment. Preferably, the temperature T2 is between about 90 and 120 degrees Celsius greater than the temperature T1, the temperature T1 is within the range of about 0 to 30 degrees Celsius, and the temperature T2 is within the range of about 120 to 150 degrees Celsius. Alternative temperatures may be used, depending on the photoresist formulation.

In accordance with an embodiment, the temperature cycling is performed within a dry oven with inert atmosphere. In accordance with an embodiment, the transitions between T1 and T2, and between T2 and T1, are relatively rapid, as shown in FIG. 10, to promote stress and delamination of the dielectric optical coating 940 over the photoresist 920, as well as photoresist reflow, all of which contribute to micro-cracks 960. In accordance with an embodiment, the temperature cycling is performed for about 60 to 120 seconds, with the temperature remaining at each of the different temperature (e.g., T1 and T2) for at least 10 seconds, before transitioning to another one of the temperatures. In accordance with specific embodiments, the temperature cycling process occurs for about 15 minutes or less, and preferably for about 5 minutes or less, and even more preferably for about 2 minutes or less. In specific embodiments, the temperature cycling process occurs for between about 1 and 2 minutes. Other variations are possible, and within the scope of an embodiment of the present invention.

Micro-cracks are caused by the temperature cycling, as a result of thermal expansion and thermal contraction, and are generally illustrated by the dashed crooked line 960 in FIG. 9(*d*). The arrows 970 are used to illustrate delamination. Both the dielectric optical coating 940 and the photoresist 920 will expand and contract during the temperature cycling. However, photoresist polymers have a much higher coefficient of expansion (typically at least 10× higher) than dielectric optical coatings, which advantageously contributes to the micro-cracking and delaminating of the dielectric optical coating 960.

The use of the temperature cycling should reduce the soak duration (during the lift-off process) by at least a factor of two, and by potentially by a factor of ten or more. For example, it is estimated that the lift-off process will take about 15 to 30 minutes following the temperature cycling step, which is significantly faster than the up to nine hours it might take if the temperature cycling step was not performed.

While transitioning between two temperatures (e.g., T1 and T2) is sufficient, it is possible and within the scope of an embodiment of the present invention that three or more different temperatures (e.g., T1, T2 and T3) can be used to perform the thermal shock.

In accordance with certain embodiments, the soft bake process can be performed for a first period of time, and then the temperature cycling process can be performed for a second period of time, prior to using a chemical solvent bath to complete the lift-off process. In accordance with other embodiments, the temperature cycling process can be performed for a first period of time, and then the soft-bake process can be performed for a second period of time, prior to using a chemical solvent bath to complete the lift-off process. In other words, the aforementioned soft-bake and temperature cycling embodiments can both be used, e.g., one after the other.

Figure 11:
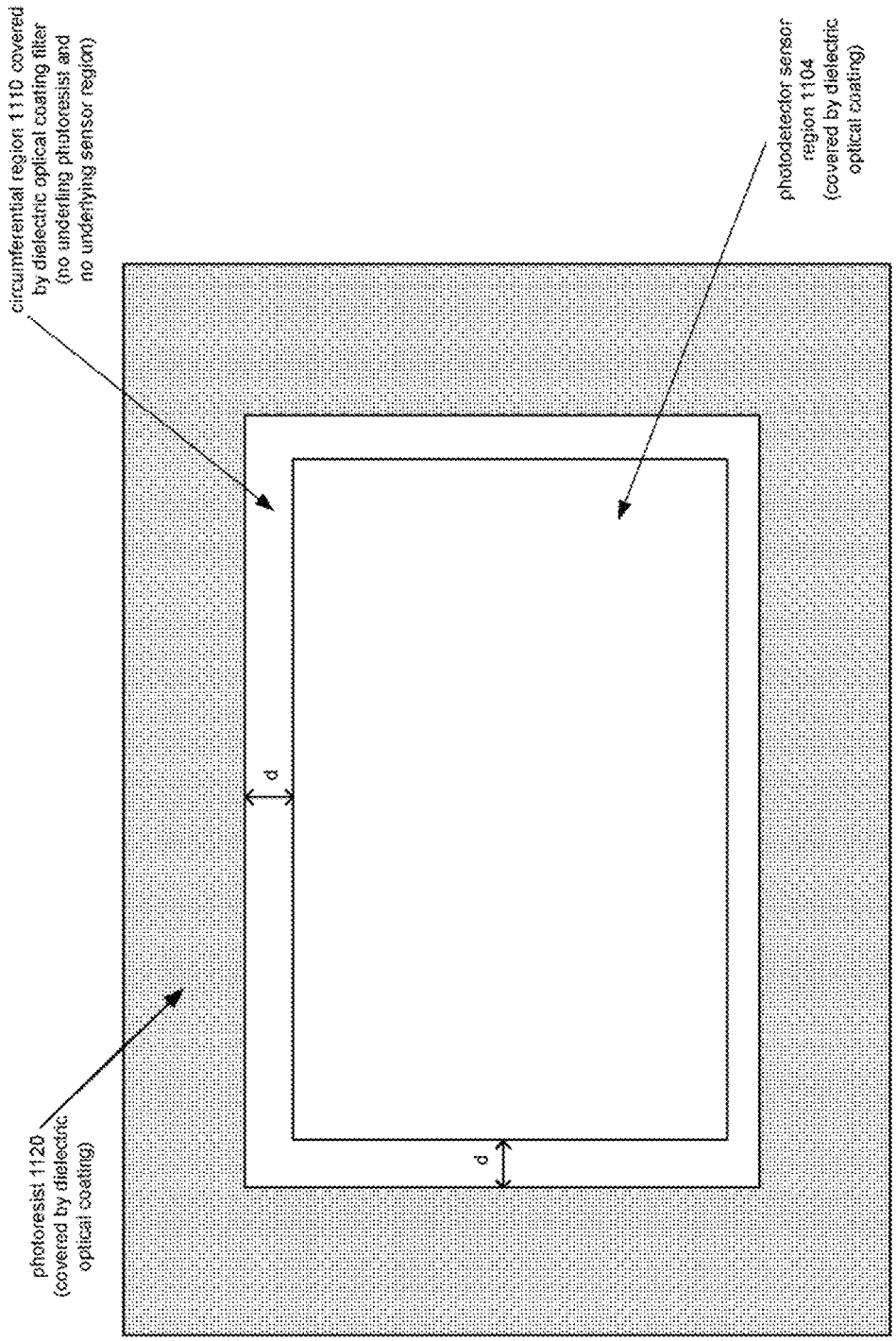
FIG. 11 illustrates a top down view of an exemplary light sensor being manufactured, wherein the light sensor includes a rectangular photodetector sensor region surrounded by photoresist and covered by a dielectric optical coating.

Referring now to FIG. 11, illustrated therein is a top down view of an exemplary light sensor in the process of being manufactured. More specifically, FIG. 11 corresponds to the point in the fabrication process after which the following steps have already been performed. A surface of a semiconductor substrate, which includes a rectangular photodetector sensor region 1104, has been covered with a photoresist. Photolithography has been used to expose a portion of the photoresist while not exposing a portion of the photoresist covering the photodetector sensor region 1104. Additionally, a circumferential area 1110 that extends beyond the sensor region 1104, having a width "d", was also not exposed. A developer has been used to remove the portion of the photoresist covering the photodetector sensor region 1104, as well as to remove the portion of the photoresist covering the circumferential area 1110, leaving the portion of the photoresist 1120 that was exposed during photolithography (which can be referred to as the exposed or remaining photoresist 1120). Also, a dielectric optical coating has been deposited over the sensor region 1104, over the circumferential area 1110, and over the remaining photoresist 1120. Accordingly, FIG. 11 essentially corresponds to a top down view of what is shown in FIGS. 4(*c*) and 5(*c*) discussed above.

Still referring to FIG. 11, the sensor region 1104 is shown as having a rectangular outer perimeter. The photoresist 1120 (which remained after the developer had been used to remove the portion of the photoresist covering the photodetector sensor region 1104 and the circumferential area 1110) has a rectangular opening that is similar in shape to the rectangular outer perimeter of the sensor region 1104. This rectangular shaped opening in the photoresist 1120 is achieved using a rectangular feature in the photomask during the photolithography step that exposes a portion of the photoresist while not exposing a portion of the photoresist covering the sensor region 1104 and the circumferential area 1110. The next step of the fabrication process would be to perform a lift-off process using a solvent to remove the remaining photoresist 1120 and the portion of the dielectric optical coating covering the photoresist 1120, to thereby produces a structure similar to what was shown in FIGS. 4(*d*) and 5(*d*). However, as mentioned above, a problem with conventional lift-off techniques is that following the dielectric optical coating deposition, the lift-off process typically requires a very long soak duration (on the order of multiple hours) due to the photoresist not being fully exposed to the solvent (because the photoresist is covered by the dielectric optical coating).

Figure 12:
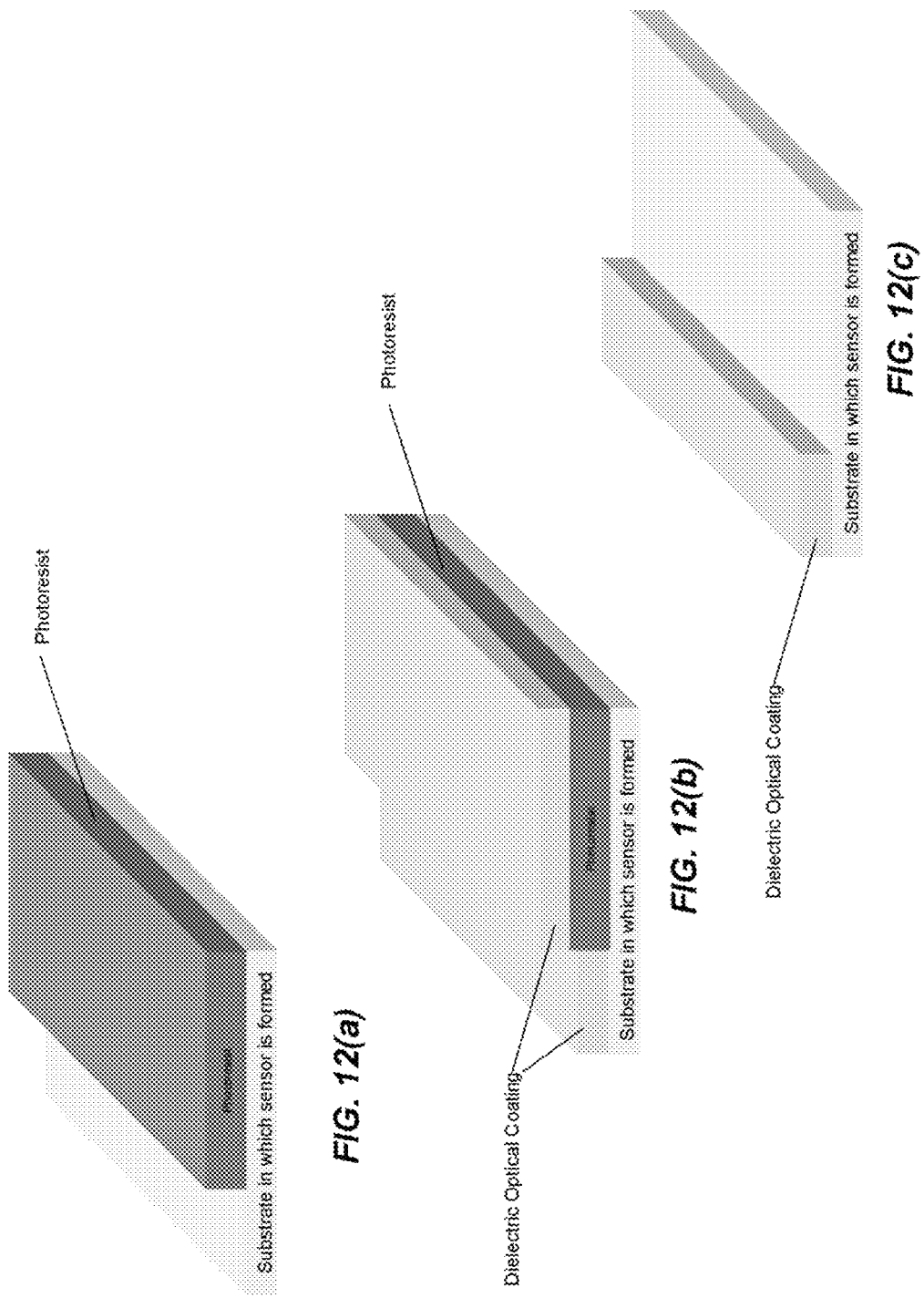
FIG. 12 includes perspective cross-sectional views that correspond to a portion of the light sensor shown in FIG. 11 during different steps of a fabrication process.

FIGS. 12(*a*), 12(*b*) and 12(*c*) are perspective cross-sectional views that correspond to a portion of the light sensor shown in FIG. 11, during different steps of the fabrication process. FIG. 12(*a*) shows a portion of a straight sidewall of the photoresist (over the sensor substrate) following exposure to a developer. FIG. 12(b) shows the same portion after deposition of the dielectric optical coating. FIG. 12(c) illustrates how the dielectric optical coating remains and the photoresist is removed as a result of the liftoff process.

The embodiments of the present invention described above with reference to FIGS. 6-10 relied on a soft bake process and/or a temperature cycling process to purposely form micro-cracks in (and potentially cause delaminating of) the dielectric optical coating covering the photoresist, which enable the lift-off process to be performed much more quickly than if no (or less) micro-cracks were formed. Additional embodiments of the present invention, which are described below, use alternative techniques to purposely form micro-cracks in the dielectric optical coating covering the photoresist, and more specifically, to significantly increase the number of micro-cracks. Thus, such additional embodiments can also be used to significantly reduced the amount of time required for the lift-off process.

The inventors have discovered that micro-cracks more readily appear near sharp corners in the photoresist over which the dielectric optical coating is deposited. In FIG. 11, note that the rectangular opening in the photoresist 1120 includes only four sharp corners. To increase the number of micro-cracks formed in the dielectric optical coating covering the photoresist, one or more dummy corners, dummy islands and/or dummy rings are included in the photomask used during the photolithography step (to expose a portion of the photoresist while not exposing a portion of the photoresist covering the photodetector sensor region). Such added corners, islands and rings are referred to as "dummy" features because they are not actually needed to form an underlying feature of the light sensor being manufactured, but rather, are included for the sole purpose of increasing micro-crack formations as well as the edge surface area, thereby improving lift-off efficiency and consistency. More specifically, the additional corners increase local strain, which results in micro-cracks that are similar to those described above with reference to FIGS. 6(d) and 9(d). The additional edge area and micro-cracks both accelerate the photoresist removal. As will be appreciated from FIGS. 14, 16 and 19, discussed below, features corresponding to the one or more dummy corners, dummy islands and/or dummy rings will remains following the photoresist removal step. However, because these remaining features (which can be referred to as dummy features) are outside the active photodetector sensor region, they do not adversely affect operation of the final light sensor.

Figure 13:
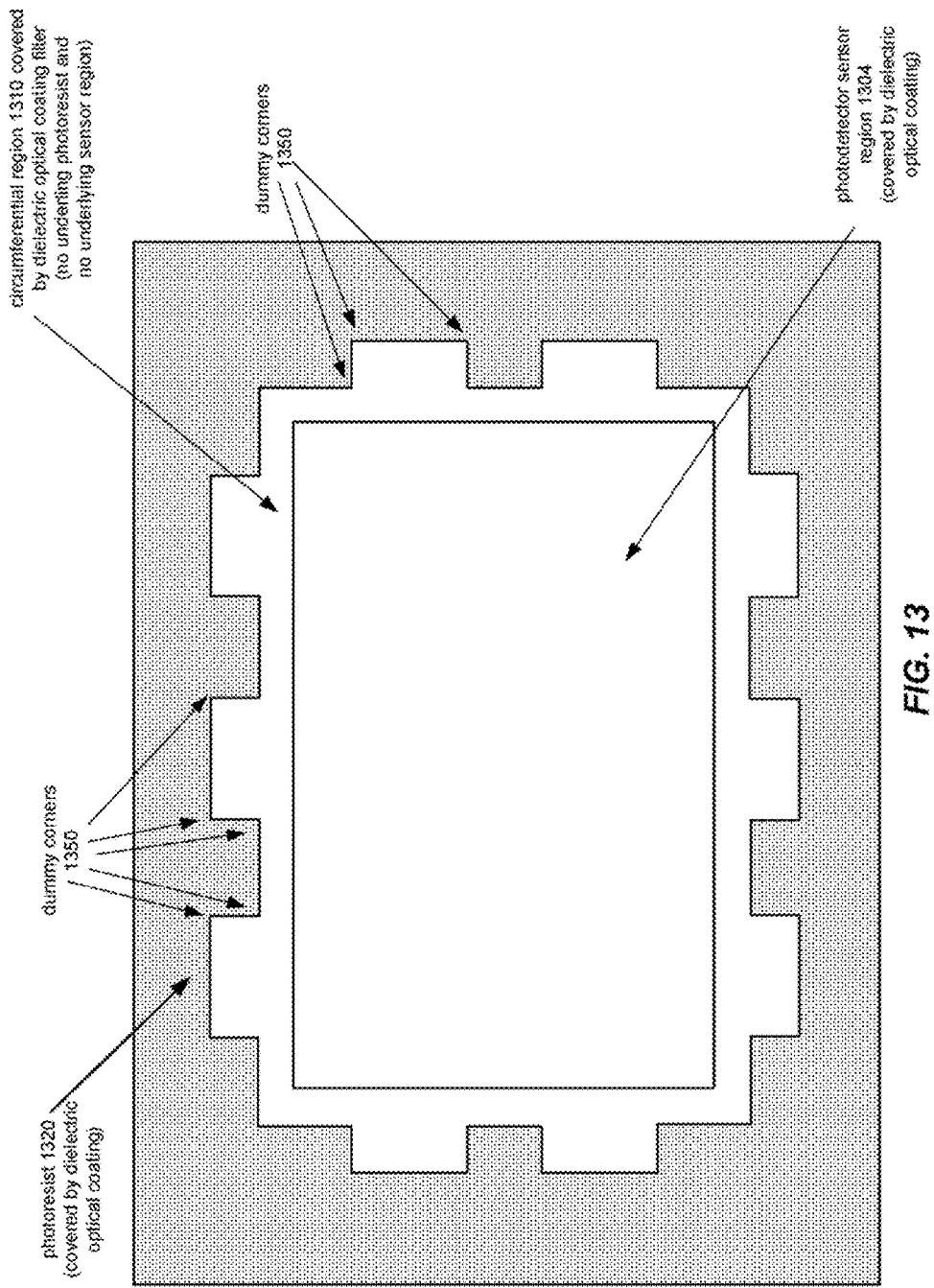
FIG. 13, which is used to describe an embodiment of the present invention, illustrates a top down view of an exemplary light sensor being manufactured, wherein the light sensor includes a rectangular photodetector sensor region surrounded by photoresist and covered by a dielectric optical coating, and wherein the photoresist includes additional corners compared to FIG. 11.

The various embodiments of the present invention, described below with reference to FIGS. 13-19, involve the adding of dummy corners, dummy islands and/or dummy rings (all of which add additional corners) in the photomask, which result in additional corners and edge surface area at the perimeters of the photoresist and dielectric optical coating. Referring to FIG. 13, illustrated therein is a top down view of photodetector sensor region 1304 having a rectangular perimeter, as was the case also in FIG. 11. However, in contrast to FIG. 11, in FIG. 13 the perimeters of the photoresist and dielectric optical coating perimeter have numerous additional 90 degree corners 1350. These additional corners 1350, which are examples of dummy corners, are achieved by adding dummy corners in the photomask used to expose selective portions of the photoresist to UV light. The added corners also increase the edge surface areas (which can also be referred to as the perimeter surface areas) of the photoresist and the dielectric optical coating by about 40% compared to the edge surface areas in FIG. 11. The dummy corners increase local strain, which results in an increased number of micro-cracks that are similar to those described above with reference to FIGS. 6(d), 8 and 9(d). The additional edge surface areas and the additional micro-cracks both accelerate the photoresist removal and increase the lift-off process margin. In FIG. 13 the perimeters of the photoresist and dielectric optical coating includes a total of forty-four corners, forty of which can be considered dummy corners.

Figures 14A, 14B, 14C:
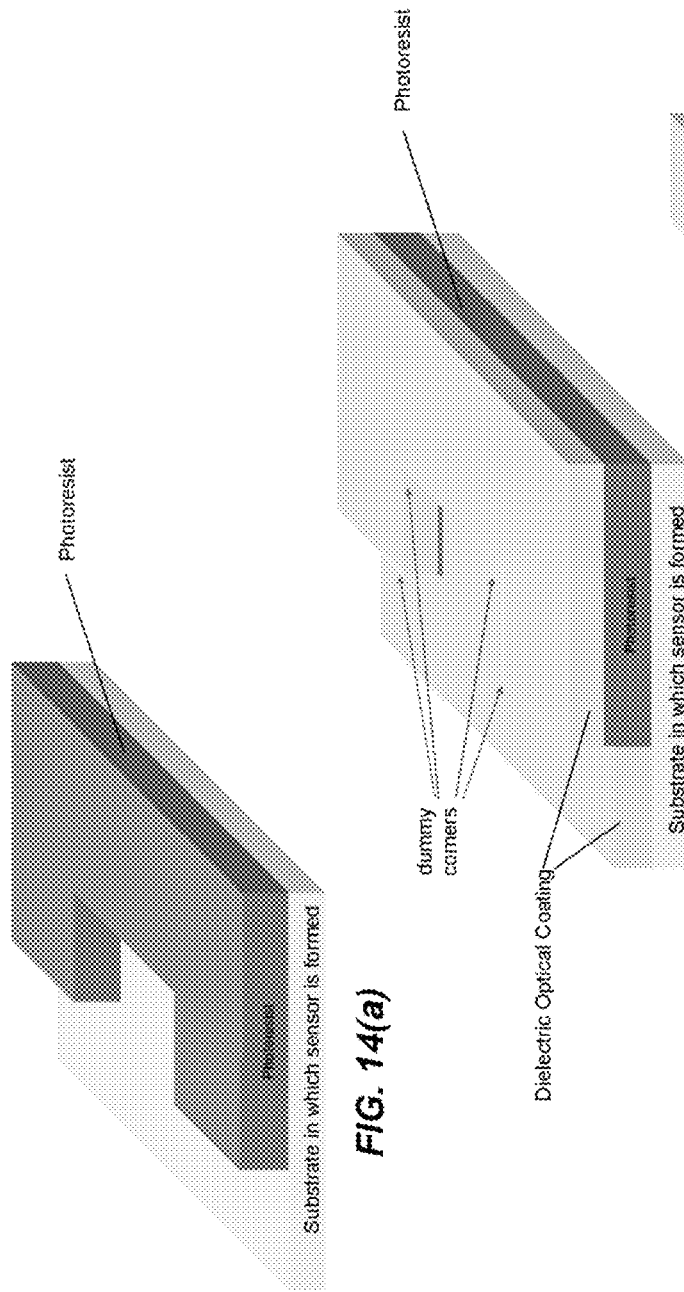
FIG. 14 includes perspective cross-sectional views that correspond to a portion of the light sensor shown in FIG. 13 during different steps of a fabrication process.

FIGS. 14(a), 14(b) and 14(c) are perspective cross-sectional views that correspond to a portion of the light sensor shown in FIG. 13, during different steps of the fabrication process. FIG. 14(a) shows a portion of a sidewall of the photoresist (over the sensor substrate) following exposure to a developer, wherein the sidewall includes four more 90 degree corners compared to FIG. 12(a). FIG. 14(b) shows the same portion after deposition of the dielectric optical coating, similarly showing four more 90 degree corners compared to FIG. 12(b). FIG. 14(c) illustrates how the dielectric optical coating remains and the photoresist is removed as a result of the liftoff process. The portion of the dielectric optical coating that is shown in FIG. 14(c), but was not shown in FIG. 12(c), can be considered a dummy dielectric optical coating feature. However, because the dummy dielectric optical coating feature is outside of the photodetector sensor region, it will not adversely affect the function of the resulting light sensor.

Figure 15:
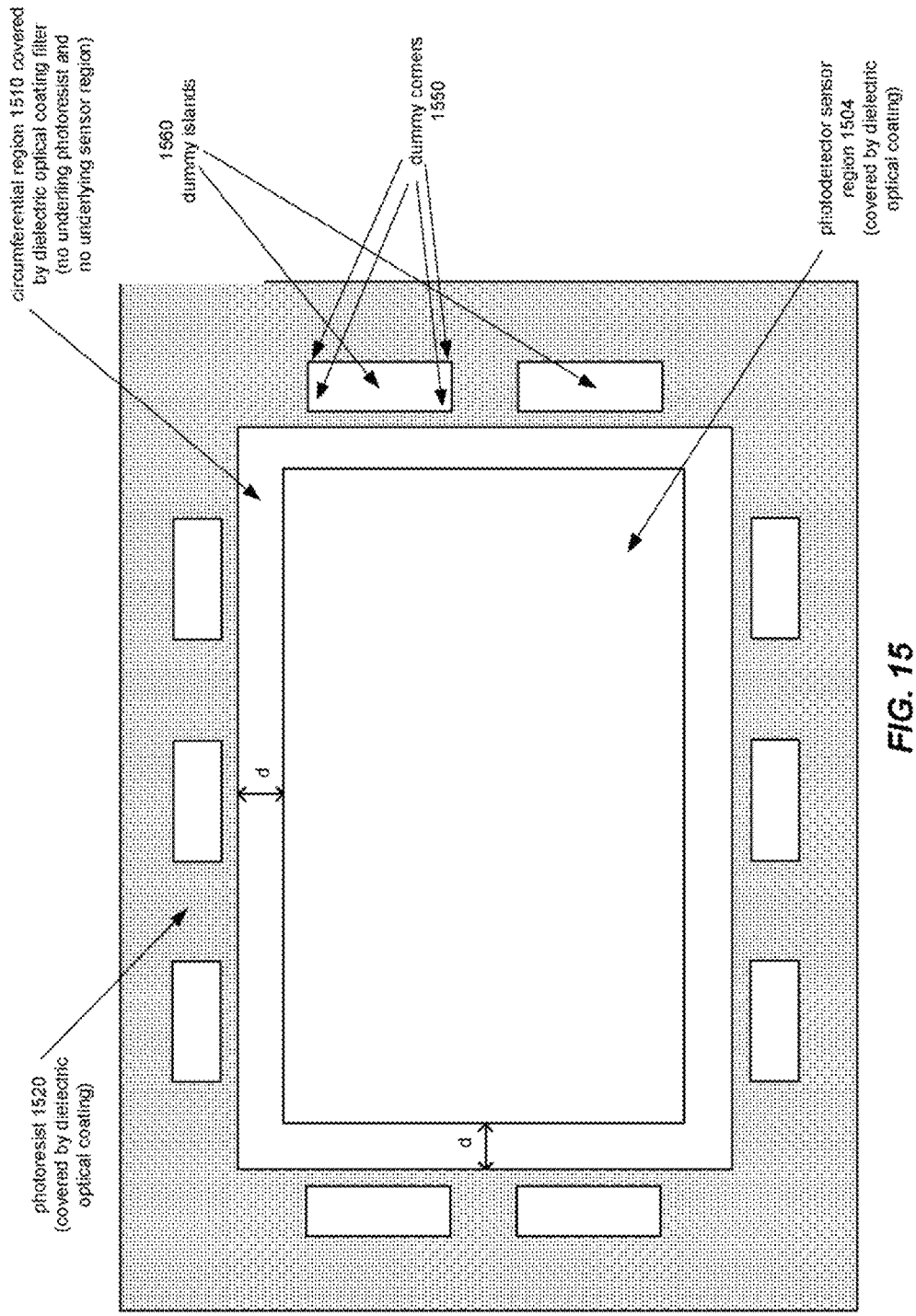
FIG. 15, which is used to describe an embodiment of the present invention, illustrates a top down view of an exemplary light sensor being manufactured, wherein the light sensor includes a rectangular photodetector sensor region surrounded by photoresist and covered by a dielectric optical coating, and wherein the photoresist includes dummy islands that provide additional corners compared to FIG. 11.

Referring now to FIG. 15, illustrated therein is a top down view of a photodetector sensor region 1504 having a rectangular perimeter, as was the case also in FIGS. 11 and 13. Also shown are the circumferential area 1510 covered by the dielectric optical coating (with no underlying photodetector sensor region and no underlying photoresist), and the exposed photoresist 1520 covered by the dielectric optical coating. In contrast to FIG. 11, in FIG. 15 the photoresist 1520 has several rectangular dummy islands 1560 (ten are shown) beyond the sensor region 1504. Each rectangular dummy island 1560, which can also be referred to as a dummy island opening in the photoresist, include four 90 degree corners 1550. These additional corners 1550, which are also examples of dummy corners, increase local strain, which results in an increased number of micro-cracks that are similar to those described above with reference to FIGS. 6(d), 8 and 9(d). The additional edge surface area and the additional micro-cracks both accelerate the photoresist removal and increase the lift-off process margin. In FIG. 15, since each of the ten dummy islands 1560 adds four dummy corners 1550, there are a total of forty dummy corners 1550.

FIGS. 16(a), 16(b) and 16(c) are perspective cross-sectional views that correspond to a portion of the light sensor shown in FIG. 15, during different steps of the fabrication process. FIG. 15(a) shows a portion of a sidewall of the photoresist (over the sensor substrate) following exposure to a developer, wherein the photoresist layer includes a rectangular opening or window having four 90 degree corners. FIG. 16(b) shows the same portion after deposition of the dielectric optical coating. FIG. 16(c) illustrates how the dielectric optical coating remains and the photoresist is removed as a result of the lift-off process. The portion of the dielectric optical coating that is shown in FIG. 16(c), but was not shown in FIG. 12(c), can be considered a dummy dielectric optical coating feature. However, because the dummy dielectric optical coating feature is outside of the photodetector sensor region, it will not adversely affect the function of the resulting light sensor.

Figure 17:
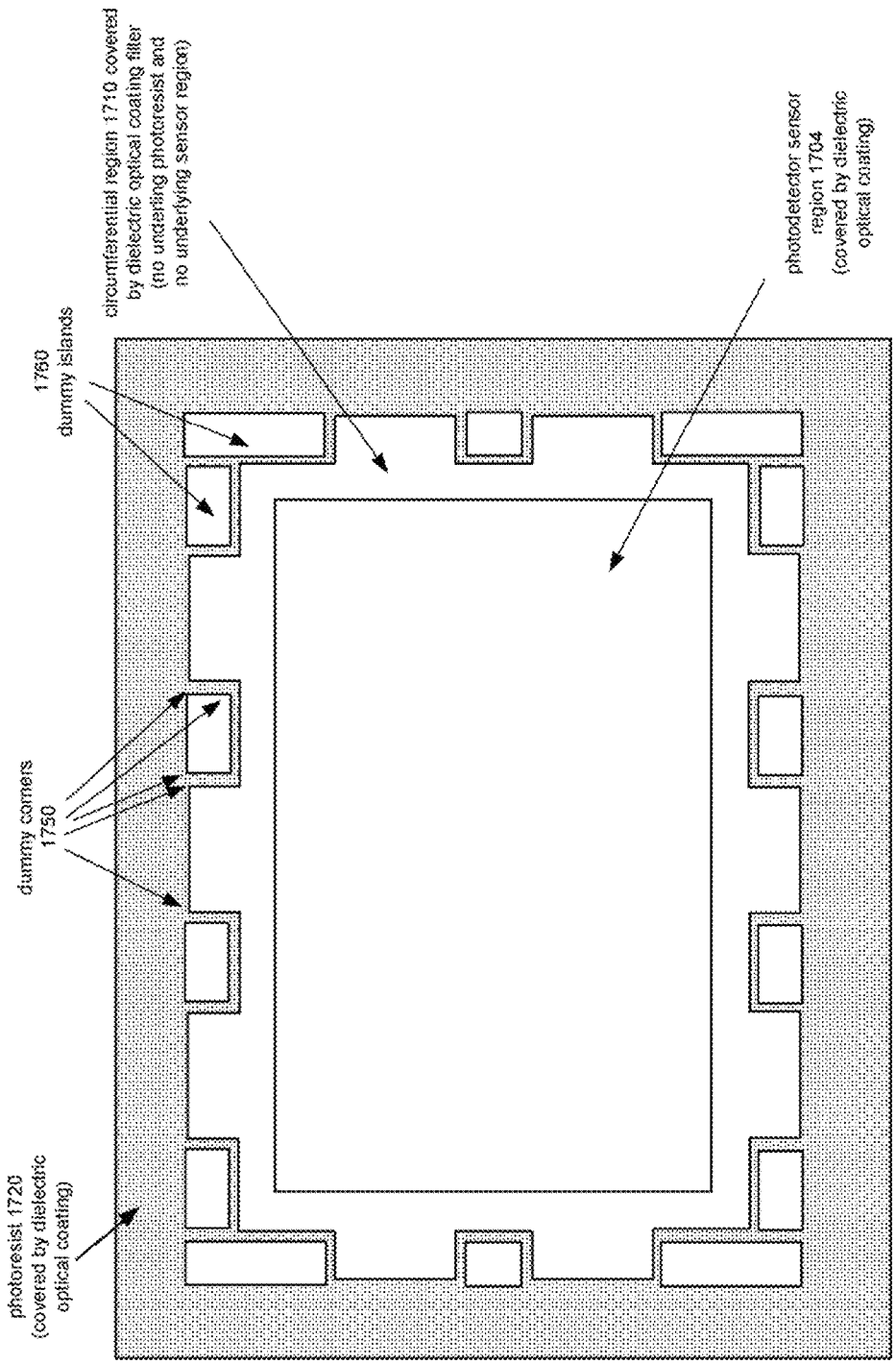
FIG. 17 is used to describe an embodiment of the present invention that combines the embodiment described with reference to FIGS. 13 and 14, with the embodiment described with reference to FIGS. 15 and 16.

FIG. 17 illustrate an embodiment which essentially combines the embodiment described with reference to FIGS. 13 and 14 with the embodiment described with reference to FIGS. 15 and 16. FIG. 17 shows a photodetector sensor region 1704 having a rectangular perimeter, as was the case also in FIGS. 11, 13 and 15. Also shown are the circumferential area 1710 covered by the dielectric optical coating (with no underlying photodetector sensor region and no underlying photoresist) and the exposed photoresist 1720 covered by the dielectric optical coating. In FIG. 17, there are fourteen dummy islands 1760, each of which provide four dummy corners 1750. Also, there are an additional forty dummy corners 1750 not provided by the dummy islands. Thus, in FIG. 17, there are a total of ninety-six dummy corners 1750.

Figure 18:
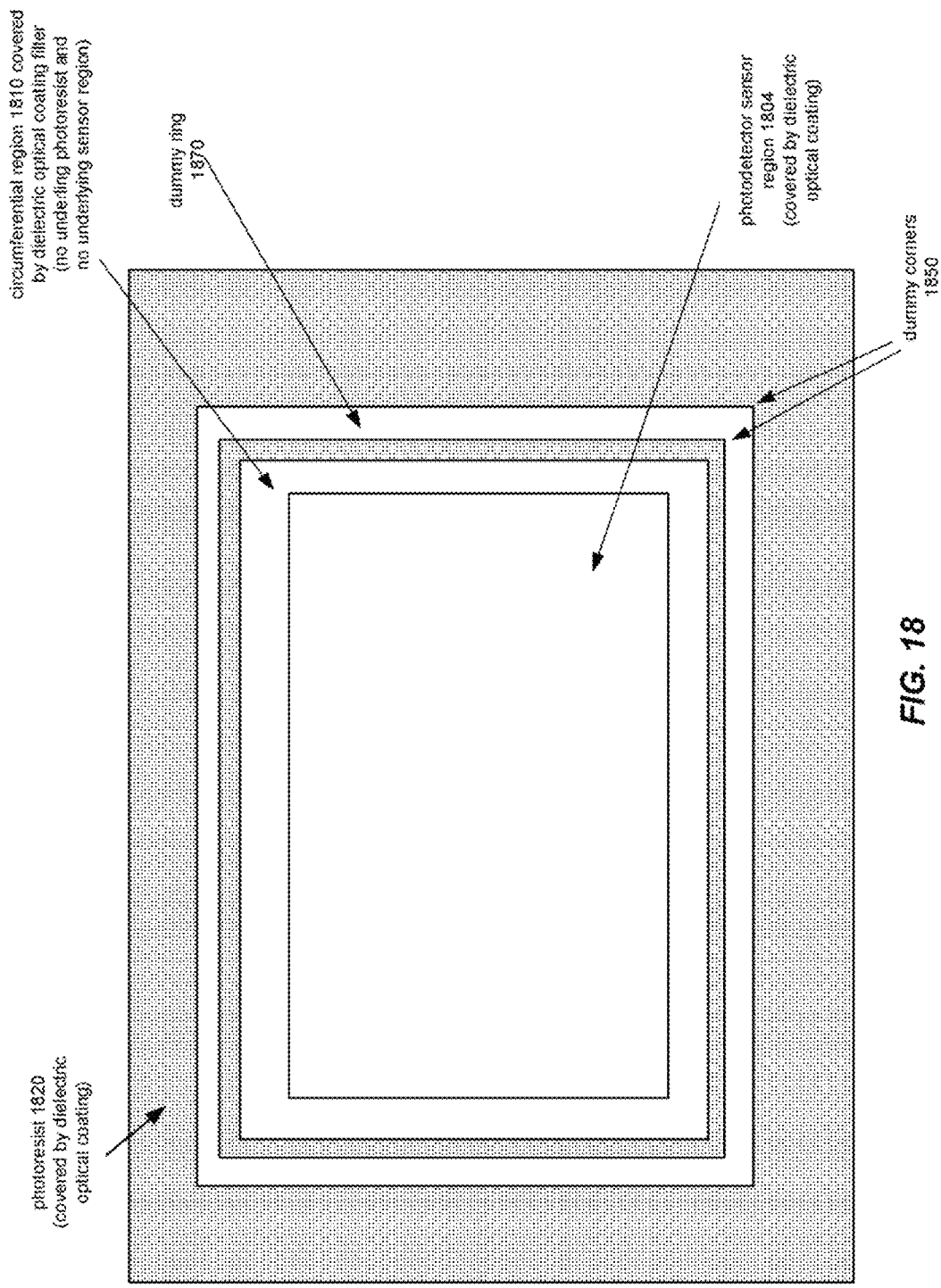
FIG. 18, which is used to describe an embodiment of the present invention, illustrates a top down view of an exemplary light sensor being manufactured, wherein the light sensor includes a rectangular photodetector sensor region surrounded by photoresist and covered by a dielectric optical coating, and wherein the photoresist includes a dummy ring that provides additional corners compared to FIG. 11.

FIGS. 18 and 19 illustrate yet another variation on the embodiments described above with reference FIGS. 13-17. FIG. 18 shows a photodetector sensor region 1804 having a rectangular perimeter, as was the case also in FIGS. 11, 13, 15 and 17. Also shown are the circumferential area 1810 covered by the dielectric optical coating (with no underlying photodetector sensor region and no underlying photoresist) and the exposed photoresist 1820 covered by the dielectric optical coating. A dummy ring 1870 is provided, which adds eight dummy corners 1850. Additionally, the dummy ring 1870 increases the edge surface areas of the photoresist and the dielectric optical coating by about 100% compared to the edge surface areas in FIG. 11. FIGS. 19(*a*), 19(*b*) and 19(*c*) are perspective cross-sectional views that correspond to the light sensor shown in FIG. 18, during different steps of the fabrication process.

While the dummy corners shown in FIGS. 13-19 were shown as being 90 degree corners, dummy corners of other angles are also possible and within the scope of the present invention. Further, it is noted that each of the dummy corners is preferably a sharp corner, as opposed to a rounded corner, because sharp corners result in more local stress and thereby will result in more micro-cracks.

The embodiments described with reference to FIGS. 13-19 can be combined with the embodiments described with reference to FIGS. 6-8 and/or the embodiments described with reference to FIGS. 8-9.

For illustrative purposes, exemplary additional details of a dielectric optical coating (which can also be referred to as a dielectric optical filter) are provided below. The dielectric materials used to form a dielectric optical filter can include silicon dioxide ($SiO_2$), silicon hydride ($Si_xH_y$), silicon nitride ($Si_xN_y$), silicon oxynitride ($Si_xO_zN_y$), tantalum oxide ($Ta_xO_y$), gallium arsenide (GaAs), gallium nitride (GaN), and the like. Alternating layers in the optical filter may have a constant or varying film thickness throughout the filter stack, in order to achieve the desired optical response. By careful choice of the exact composition, thickness, and number of these layers, it is possible to tailor the reflectivity and transmissivity of the optical filter to produce almost any desired spectral characteristics. For example, the reflectivity can be increased to greater than 99.99%, to produce a high-reflector (HR) coating. The level of reflectivity can also be tuned to any particular value, for instance to produce a mirror that reflects 90% and transmits 10% of the light that falls on it, over some range of wavelengths. Such mirrors have often been used as beam splitters, and as output couplers in lasers. Alternatively, the optical filter can be designed such that the mirror reflects light only in a narrow band of wavelengths, producing a reflective optical filter.

Generally, layers of high and low refractive index materials are alternated one above the other. This periodic or alternating structure significantly enhances the reflectivity of the surface in the certain wavelength range called band-stop, which width is determined by the ratio of the two used indices only (for quarter-wave system), while the maximum reflectivity is increasing nearly up to 100% with a number of layers in the stack. The thicknesses of the layers are generally quarter-wave (then they yield to the broadest high reflection band in comparison to the non-quarter-wave systems composed from the same materials), designed such that reflected beams constructively interfere with one another to maximize reflection and minimize transmission. Using the above described structures, high reflective coatings can achieve very high (e.g., 99.9%) reflectivity over a broad wavelength range (tens of nanometers in the visible spectrum range), with a lower reflectivity over other wavelength ranges, to thereby achieve a desired spectral response. By manipulating the exact thickness and composition of the layers in the reflective stack, the reflection characteristics can be tuned to a desired spectral response, and may incorporate both high-reflective and anti-reflective wavelength regions. The coating can be designed as a long-pass or short-pass filter, a bandpass or notch filter, or a mirror with a specific reflectivity.

In accordance with specific embodiments of the present invention, an optical filter is used to shape the spectral response of the underlying photo detector region to obtain a true human eye spectral response, i.e., a response that is similar to that of a typical human eye response. Alternative spectral responses are possible, and within the scope of the present invention.

Figure 20:
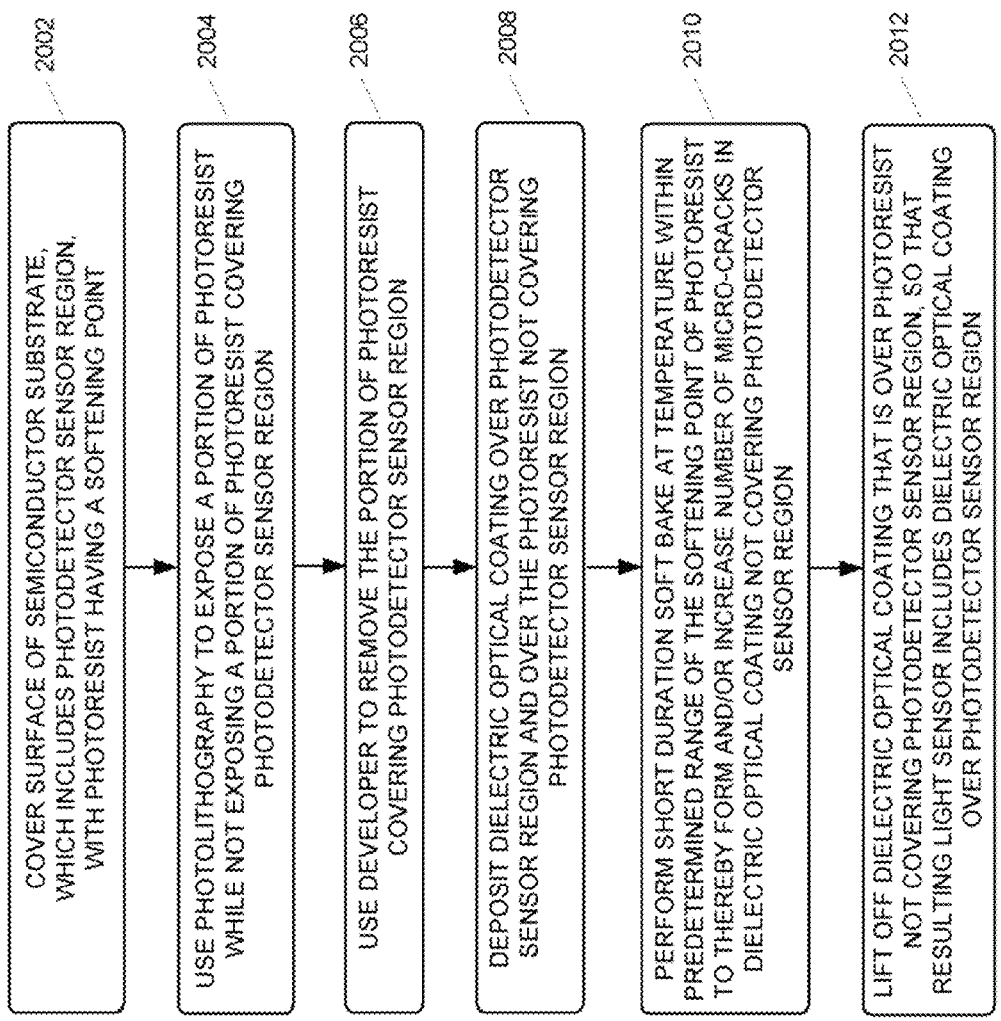
FIG. 20 is a high level flow diagram used to summarize the soft bake embodiments described with reference to FIGS. 6-8.
Figure 21:
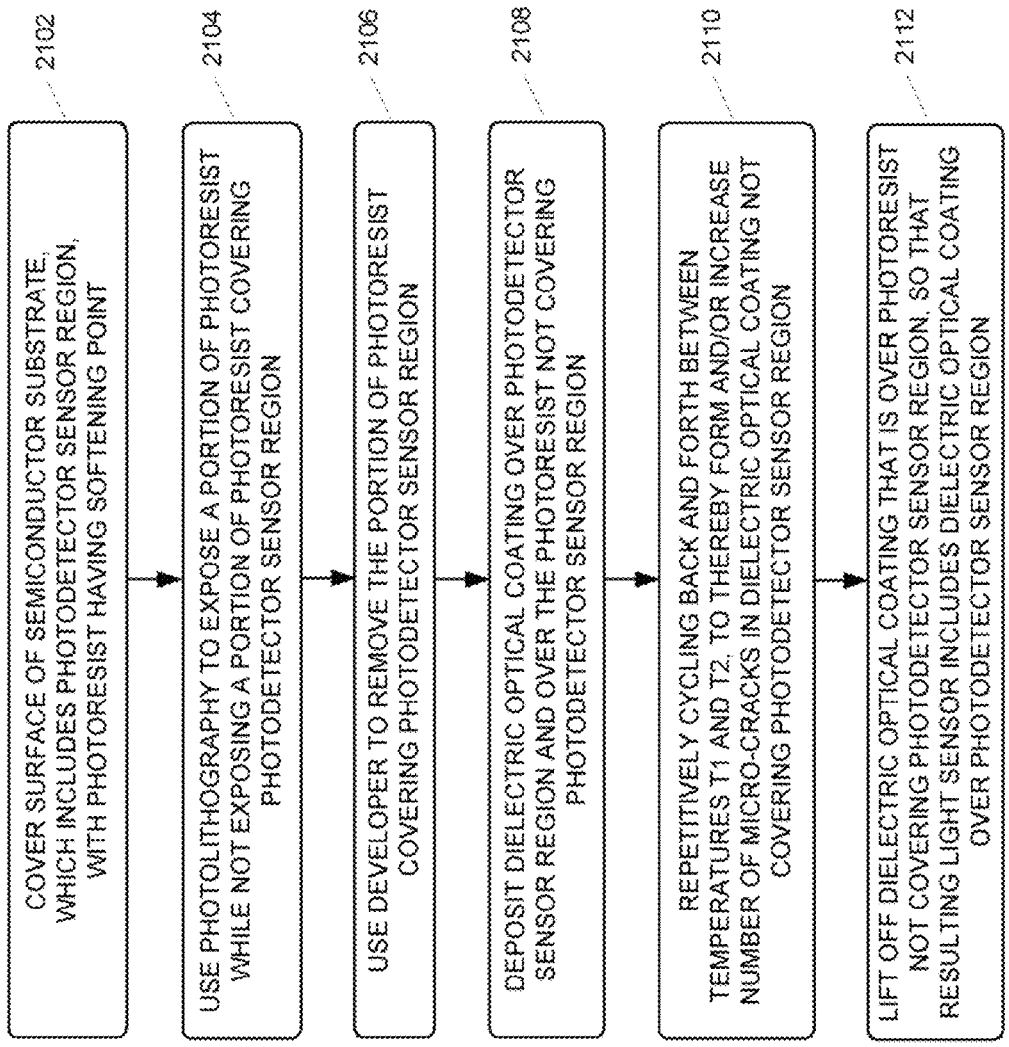
FIG. 21 is a high level flow diagram used to summarize the temperature cycling embodiments described with reference to FIGS. 9-10.
Figure 22:
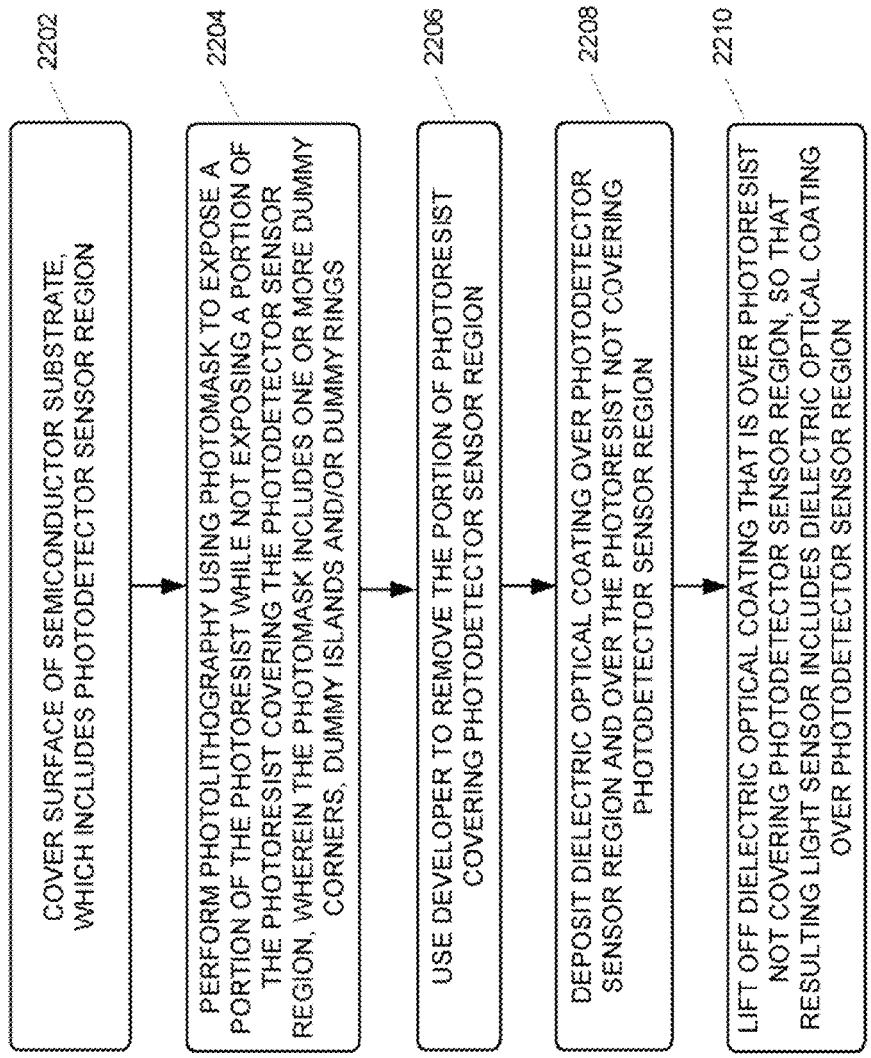
FIG. 22 is a high level flow diagram used to summarize the embodiments described with reference to FIGS. 11-19.

Various embodiments of the present invention will now be summarized with reference to the high level flow diagrams of FIGS. 20-22.

FIG. 20 is used to summarize the short duration soft bake embodiments described above with reference to FIGS. 6-8. Referring to FIG. 20, at step 2002, a surface of a semiconductor substrate, which includes a photodetector sensor region, is covered with a photoresist having a softening point ($T_{soft}$). At step 2004, photolithography is used to expose a portion of the photoresist while not exposing a portion of the photoresist covering the photodetector sensor region. At step 2006, the portion of the photoresist covering the photodetector sensor region is removed using a developer. At step 2008, a dielectric optical coating is deposited over the photodetector sensor region and over the photoresist not covering the photodetector sensor region. At step 2010, a short duration soft bake at a temperature ($T_{soft\_bake}$) is performed within a predetermined range of the softening point ($T_{soft}$) of the photoresist to thereby form and/or increase a number of micro-cracks in the dielectric optical coating not covering the photodetector sensor region. At step 2012, the dielectric optical coating that is over the photoresist not covering the photodetector sensor region is lifted off, so that the resulting light sensor includes the dielectric optical coating over the photodetector sensor region. Additional details of the techniques summarized in FIG. 20 can be appreciated from the above discussion of FIGS. 6-8.

FIG. 21 is used to summarize the temperature cycling embodiments described above with reference to FIGS. 9-10. Referring to FIG. 21, steps 2102, 2104, 2106 and 2108 of FIG. 21 are identical to steps 2002, 2004, 2006 and 2008 described above with reference to FIG. 20, and thus need not be described again. At step 2110, temperature cycling is performed by repetitively cycling back and forth between at least two temperatures T1 and T2, to thereby form and/or increase a number of micro-cracks in the dielectric optical coating not covering the photodetector sensor region. In specific embodiment, the temperature T2 is between about 50 and 120 degrees Celsius greater than the temperature T1. At step 2112, the dielectric optical coating that is over the photoresist not covering the photodetector sensor region is lifted off, so that the resulting light sensor includes the dielectric optical coating over the photodetector sensor region. Additional details of the techniques summarized in FIG. 21 can be appreciated from the above discussion of FIGS. 9-10.

FIG. 22 is used to summarize the embodiments described above with reference to FIGS. 11-19. Referring to FIG. 22, at step 2202, a surface of a semiconductor substrate, which includes a photodetector sensor region, is covered with photoresist. At step 2204, photolithography is performed using a photomask to expose a portion of the photoresist, while not exposing a portion of the photoresist covering the photodetector sensor region. As was described above with reference to FIGS. 13, 15, 17 and 18, the photomask used at step 2204 includes one or more dummy corners, dummy islands and/or dummy rings. At step 2206, the portion of the photoresist covering the photodetector sensor region is removed using a developer. At step 2208, a dielectric optical coating is deposited over the photodetector sensor region and the portion of the photoresist that remains following the removing at step 2206. At step 2210, the dielectric optical coating that is over the photoresist not covering the photodetector sensor region is removed, so that the resulting light sensor includes the dielectric optical coating over the photodetector sensor region. Additional details of the techniques summarized in FIG. 22 can be appreciated from the above discussion of FIGS. 11-19.

Packaged optical sensors are typically subject to significant thermal stresses during accelerated reliability testing, which can include, temperature cycling, moisture sensitivity level (MSL) tests, highly accelerated stress tests (HAST), etc. These stresses arise from the thermal expansion and contraction of films underneath the dielectric optical coating on the die substrate, as well as the thermal expansion and contraction of the package encapsulation material (which is typically a transparent epoxy). Such stresses can cause the dielectric optical coating (that covers and extends beyond the photodetector sensor region) to crack and/or delaminated, which reduces yield.

In accordance with specific embodiments of the present invention, non-orthogonal (e.g., 45°, but not limited thereto) chamfered corners are added to improve the thermal reliability of the dielectric optical coating the covers the photodetector sensor region. Such embodiments can be appreciated from FIGS. 23 and 24, which are described below.

Figure 23:
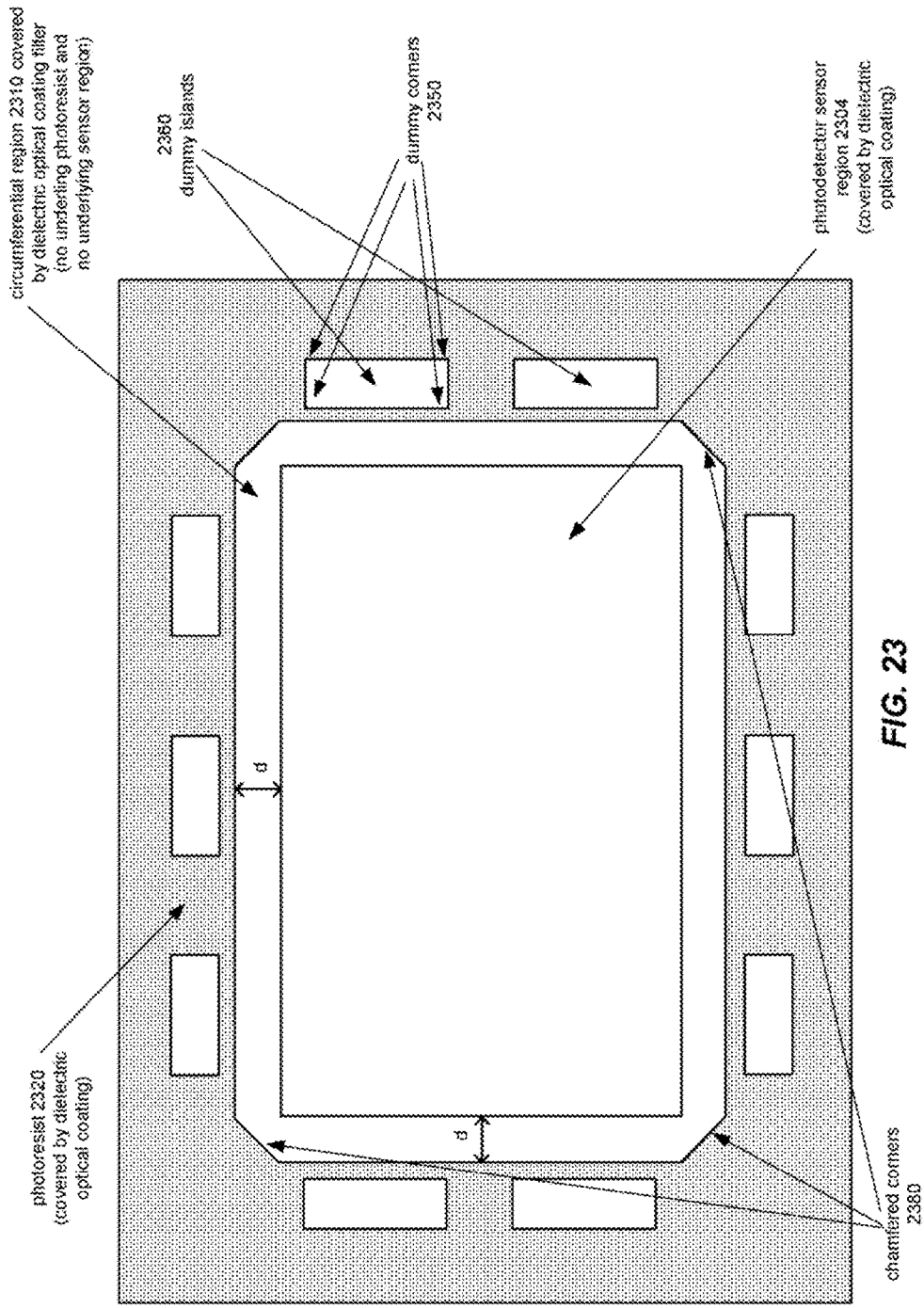
FIGS. 23 and 24 illustrates top down views of exemplary light sensors being manufactured, wherein the light sensor includes a rectangular photodetector sensor region surrounded by photoresist and covered by a dielectric optical coating having chamfered corners.

Referring first to FIG. 23, this figure is the substantially the same as FIG. 15, except that chamfered corners 2380 are added to the dielectric optical coating to improve the thermal reliability of the dielectric optical coating over a photodetector sensor region 2304. More specifically, FIG. 23 illustrates a top down view of a photodetector sensor region 2304 having a rectangular perimeter. Also shown are the circumferential area 2310 covered by the dielectric optical coating (with no underlying photodetector sensor region and no underlying photoresist), and the exposed photoresist 2320 covered by the dielectric optical coating. As was the case in FIG. 15, the photoresist 2320 has rectangular dummy islands 2360 beyond the sensor region 2304, which adds dummy corners 2350. The chamfered corners 2380 can be achieved by including chamfered corners in the photomask that is used during the photolithography step that exposes a portion of the photoresist while not exposing a portion of the photoresist covering the photodetector sensor region 2304 and the circumferential area 2310.

Figure 24:
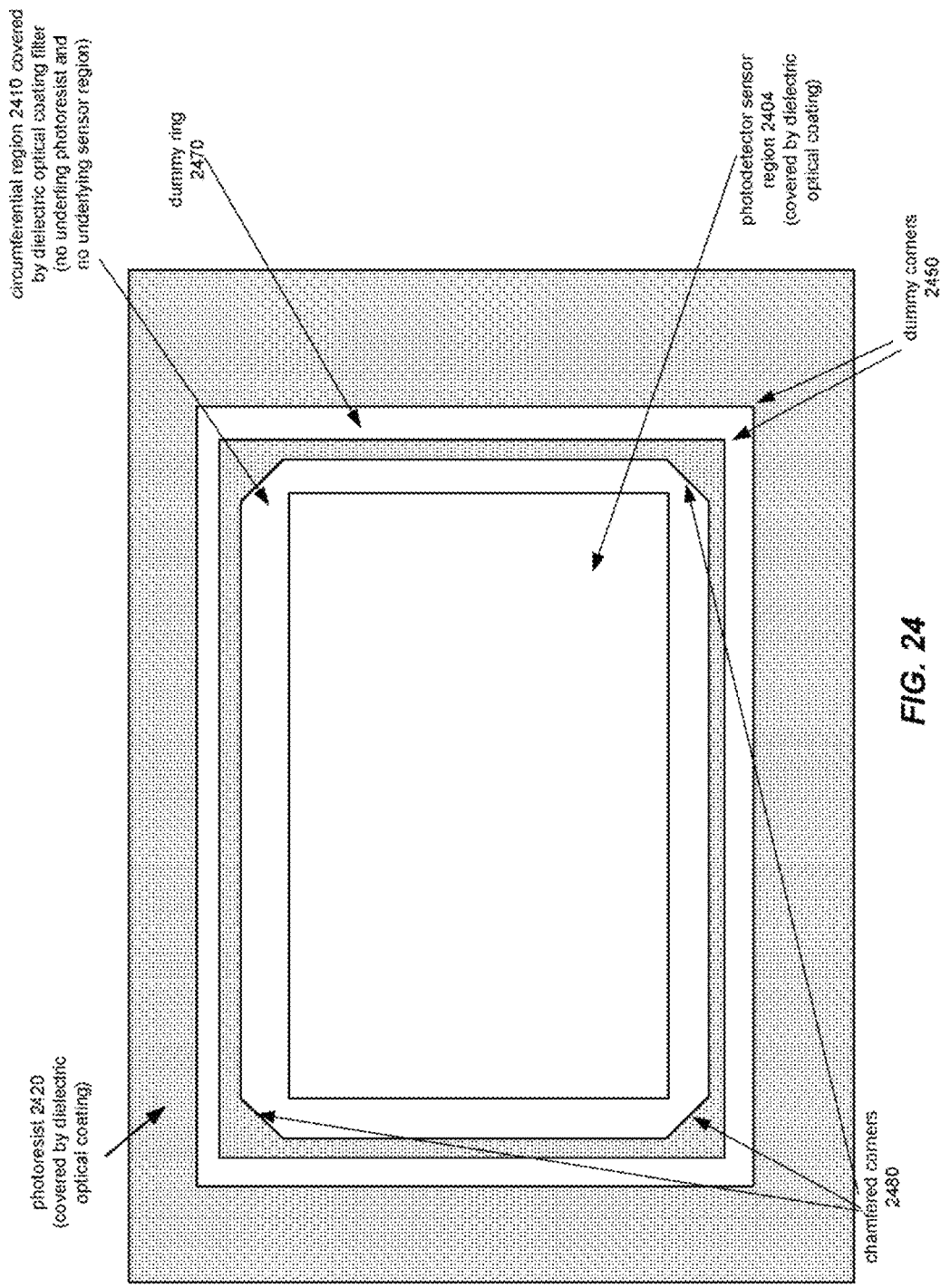

Referring next to FIG. 24, this figure is substantially the same as FIG. 18, excepts that chamfered corners 2480 are added to the dielectric optical coating to improve the thermal reliability of the dielectric optical coating over a photodetector sensor region 2404. More specifically, FIG. 24 illustrates a top down view of a photodetector sensor region 2404 having a rectangular perimeter, a circumferential area 2410 covered by the dielectric optical coating (with no underlying photodetector sensor region and no underlying photoresist), exposed photoresist 2420 covered by the dielectric optical coating, and a dummy ring 2470 that adds eight dummy corners 2450.

FIGS. 23 and 24 illustrates how chamfered corners can be included in the embodiments described above with reference to FIGS. 11-19 and 22. The chamfered corners can also be included in the embodiments described above with reference to FIGS. 6-10 and 21. It is also within the scope of an embodiment of the present invention that the chamfered corners not be combined with the other embodiments described herein.

Figure 25:
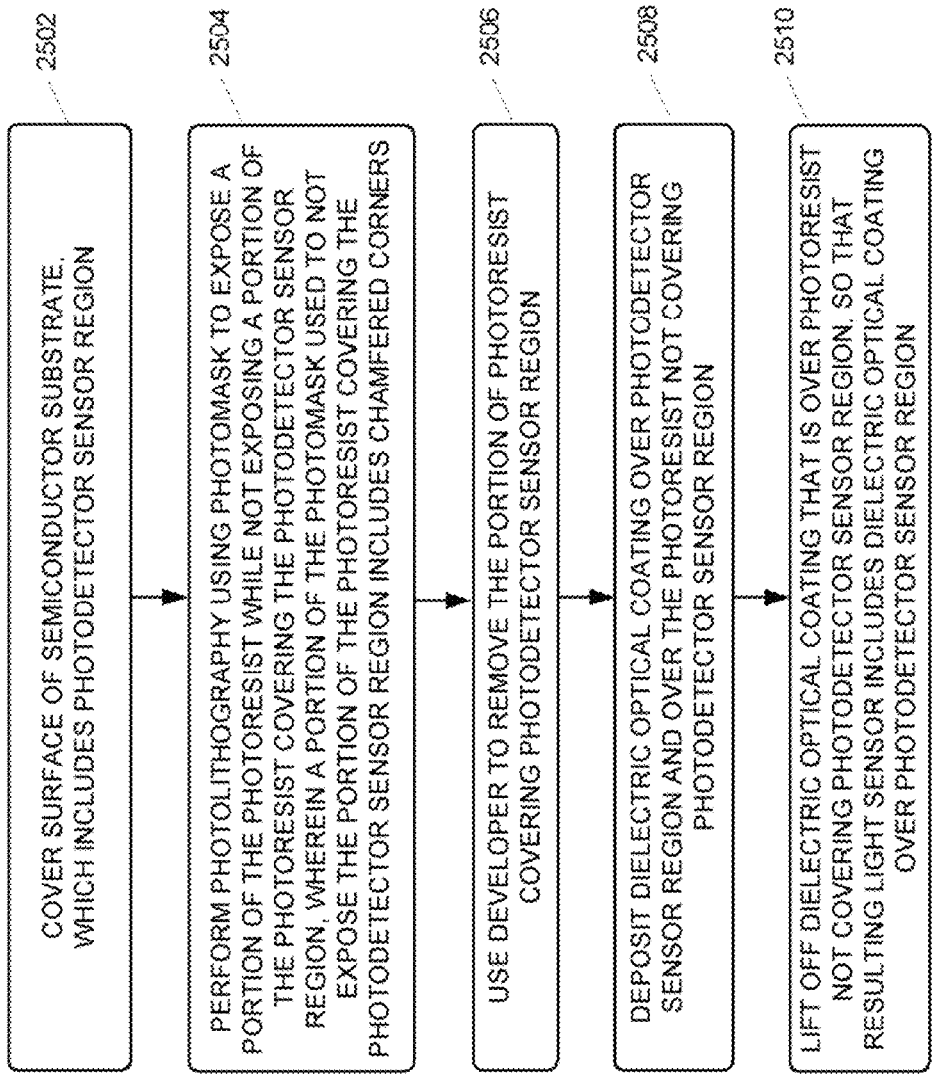
FIG. 25 is a high level flow diagram used to summarize the embodiments described above with reference to FIGS. 23 and 25.

FIG. 25 is used to summarize the embodiments described above with reference to FIGS. 23 and 24. Referring to FIG. 25, at step 2502, a surface of a semiconductor substrate, which includes a photodetector sensor region, is covered with photoresist. At step 2504, photolithography is performed using a photomask to expose a portion of the photoresist, while not exposing a portion of the photoresist covering the photodetector sensor region. As was described above with reference to FIGS. 23 and 24, a portion of the photomask used to not expose the portion of the photoresist covering the photodetector sensor region includes chamfered corners. At step 2506, the portion of the photoresist covering the photodetector sensor region is removed using a developer. At step 2508, a dielectric optical coating is deposited over the photodetector sensor region and the portion of the photoresist that remains following the removing at step 2506. At step 2510, the dielectric optical coating that is over the photoresist not covering the photodetector sensor region is removed, so that the resulting light sensor includes the dielectric optical coating over the photodetector sensor region. Because of the chamfered corners included in photomask used at step 2504, following the lifting off at step 2510, a portion of the dielectric optical coating that extends beyond the photodetector sensor region includes chamfered corners. Additional details of the techniques summarized in FIG. 25 can be appreciated from the above discussion of FIGS. 23 and 24.

There exist both positive and negative types of photoresists. When a positive photoresist is exposed to UV light the chemical structure of the photoresist changes so that it becomes more soluble in a developer. The exposed photoresist is then washed away by the developer, leaving windows in the photoresist where the photoresist was exposed to UV light. Accordingly, when using a positive photoresist the photomask includes an exact copy of the pattern which is to remain on the wafer. Negative photoresists behave in the opposite manner. That is, exposure to the UV light causes the negative photoresist to become less soluble in a developer. Therefore, the negative photoresist remains on the surface wherever it was exposed, and the developer removes only the unexposed portions. Accordingly, a photomask used with a negative photoresist includes the inverse (or photographic "negative") of the pattern to be transferred.

In the embodiments described above, the photoresists (e.g., 620, 920, 1120, 1230, 1520, 1720, 1820, 2320 and 2420) that were described behaved as, and thus were, negative photoresists. However, it is also within the scope of embodiments of the present invention to use positive photoresists instead of negative photoresists. Accordingly, steps 2004 and 2104 (in FIGS. 20 and 21, respectively) can more generally involve defining a pattern in the photoresist. Similarly, step 2204 (in FIG. 22) can more generally involve performing photolithography using a photomask to define a pattern in the photoresist that includes one or more dummy corners, dummy islands and/or dummy rings. Further, step 2504 (in FIG. 25) can more generally involve performing photolithography using a photomask to define a pattern in the photoresist that includes chamfered corners.

Embodiments of the present invention are also directed to light sensors formed used the above described techniques, and systems that include such sensors.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed:

1. A method for fabricating a light sensor, comprising:
    (a) covering a surface of a semiconductor substrate, which includes a photodetector sensor region, with photoresist;
    (b) performing photolithography using a photomask to define a pattern in the photoresist that includes one or more dummy corners, dummy islands and/or dummy rings in a region that is beyond the photodetector sensor region, but is within a region that will be covered by a dielectric optical coating at a depositing step (d);
    (c) using a developer, removing a portion of the photoresist that covered the photodetector sensor region and covered a circumferential region surrounding the photodetector sensor region, wherein the portion of the photoresist that is removed and a portion of the photoresist that remains depends on the pattern defined at step (b);
    (d) depositing a dielectric optical coating over the photodetector sensor region, over the circumferential region, and over the photoresist not covering the photodetector sensor region that remained after the removing at step (c); and
    (e) lifting off a portion of the dielectric optical coating that is over the remaining photoresist not covering the photodetector sensor region, so that a remaining portion of the dielectric optical coating covers the photodetector sensor region and the circumferential region.

2. The method of claim 1, wherein:
    the one or more dummy corners, dummy islands and/or dummy rings enable the removing at step (c) to be performed more quickly than if the one or more dummy corners, dummy islands and/or dummy rings were not present;
    the portion of the photoresist that remains following the removing at step (c) includes features corresponding to the one or more dummy corners, dummy islands and/or dummy rings included in the photomask; and
    following the lifting off at step (e), the light sensor includes dummy dielectric optical coating features on the surface of the semiconductor substrate beyond the photodetector sensor region.

3. The method of claim 1, wherein at step (b) the photomask includes a plurality of dummy corners.

4. The method of claim 1, wherein at step (b) the photomask includes one or more dummy islands.

5. The method of claim 1, wherein at step (b) the photomask includes one or more dummy rings that surround the circumferential region surrounding the photodetector sensor region.

6. The method of claim 1, wherein step (e) comprises lifting off the portion of the dielectric optical coating that is over the remaining photoresist not covering the photodetector sensor region, so that the remaining portion of the dielectric optical coating covers the photodetector sensor region and the circumferential region, by performing a chemical solvent soak for no more than one hour.

7. The method of claim 1, wherein step (e) comprises lifting off the portion of the dielectric optical coating that is over the remaining photoresist not covering the photodetector sensor region, so that the remaining portion of the dielectric optical coating covers the photodetector sensor region and the circumferential region, by performing a chemical solvent soak for between about 15 to 30 minutes.

8. The method of claim 1, wherein the inclusion at step (b) of the one or more dummy corners, dummy islands and/or dummy rings in the region that is beyond the photodetector sensor region, but is within the region that will be covered by the dielectric optical coating at the depositing step (d), increases an edge surface area of the dielectric optical coating resulting from the depositing at step (d), as compared to if the pattern defined at step (b) did not include the one or more dummy corners, dummy islands and/or dummy rings.

9. The method of claim 1, wherein:
    the photodetector sensor region includes a plurality of sides that collectively define a periphery of the photodetector sensor region; and
    the one or more dummy corners, dummy islands and/or dummy rings comprise a plurality of dummy corners distributed around the periphery of the photodetector sensor region such that at least two dummy corners are located adjacent to each of the sides of the photodetector sensor region.

10. The method of claim 1, wherein:
    the photodetector sensor region includes a plurality of sides that collectively define a periphery of the photodetector sensor region; and
    the one or more dummy corners, dummy islands and/or dummy rings comprise a plurality of dummy corners adjacent to at least one of the sides of the photodetector sensor region.

11. The method of claim 1, wherein:
    the photodetector sensor region includes a plurality of sides that collectively define a periphery of the photodetector sensor region; and
    the one or more dummy corners, dummy islands and/or dummy rings comprise a plurality of dummy islands distributed around the periphery of the photodetector sensor region such that at least one dummy island is located adjacent to each of the sides of the photodetector sensor region.

12. The method of claim 1, wherein:
    the photodetector sensor region includes a plurality of sides that collectively define a periphery of the photodetector sensor region; and
    the one or more dummy corners, dummy islands and/or dummy rings comprise a plurality of dummy islands distributed around the periphery of the photodetector sensor region such that at least one dummy island is located adjacent to at least one of the sides of the photodetector sensor region.

13. The method of claim 1, wherein:
    the photodetector sensor region includes a plurality of sides that collectively define a periphery of the photodetector sensor region; and
    the one or more dummy corners, dummy islands and/or dummy rings comprise one or more dummy rings that surrounds the periphery of the photodetector sensor region.

14. A method for fabricating a light sensor, comprising:
    (a) covering a surface of a semiconductor substrate that includes a photodetector sensor region with photoresist, the photodetector sensor region including a plurality of sides that define a periphery of the photodetector sensor region;

(b) performing photolithography using a photomask to define a pattern in the photoresist that includes a plurality of dummy corners beyond the photodetector sensor region and adjacent to at least one of the sides of the photodetector sensor region;

(c) using a developer, removing a portion of the photoresist that covered the photodetector sensor region, wherein a portion of the photoresist that remains after step (c) includes features corresponding to the plurality of dummy corners beyond the photodetector sensor region and adjacent to the at least one of the sides of the photodetector sensor region;

(d) depositing a dielectric optical coating over the photodetector sensor region and over the photoresist that remained after the removing at step (c), and thus, over the portion of the remaining photoresist that includes features corresponding to the plurality of dummy corners beyond the photodetector sensor region and adjacent to the at least one of the sides of the photodetector sensor region; and (e) lifting off a portion of the dielectric optical coating that is over the remaining photoresist so that a remaining portion of the dielectric optical coating covers the photodetector sensor region and includes features corresponding to the plurality of dummy corners beyond the photodetector sensor region and adjacent to the at least one of the sides of the photodetector sensor region.

15. The method of claim 14, wherein the pattern in the photoresist defined at step (b) comprises a plurality of dummy corners beyond the photodetector sensor region and adjacent to each of the sides of the photodetector sensor region.

16. The method of claim 15, wherein following the lifting off at step (e), the light sensor includes dummy dielectric optical coating features beyond the photodetector sensor region and adjacent to each of the sides of the photodetector sensor region.

* * * * *